United States Patent
Uemura et al.

(10) Patent No.: US 6,777,805 B2
(45) Date of Patent: Aug. 17, 2004

(54) GROUP-III NITRIDE COMPOUND SEMICONDUCTOR DEVICE

(75) Inventors: Toshiya Uemura, Nishikasugai-gun (JP); Atsuo Hirano, Nishikasugai-gun (JP); Koichi Ota, Nishikasugai-gun (JP); Naohisa Nagasaka, Nishikasugai-gun (JP)

(73) Assignee: Toyoda Gosei Co., Ltd., Nishikasugai-gun (JP)

( * ) Notice: Subject to any disclaimer, the term of this patent is extended or adjusted under 35 U.S.C. 154(b) by 0 days.

(21) Appl. No.: 10/240,250

(22) PCT Filed: Mar. 30, 2001

(86) PCT No.: PCT/JP01/02758

§ 371 (c)(1),
(2), (4) Date: Sep. 30, 2002

(87) PCT Pub. No.: WO01/73858

PCT Pub. Date: Oct. 4, 2001

(65) Prior Publication Data

US 2003/0107053 A1 Jun. 12, 2003

(51) Int. Cl.[7] .............................................. H01L 23/48
(52) U.S. Cl. .......................... 257/745; 257/81; 257/94; 257/99
(58) Field of Search .............................. 257/81, 94, 99, 257/745, 103, 200

(56) References Cited

U.S. PATENT DOCUMENTS 6,514,782 B1 * 2/2003 Wierer et al. .................. 438/22
6,521,914 B2 * 2/2003 Krames et al. ................ 257/81
6,521,999 B1 * 2/2003 Uemura et al. ............... 257/745

FOREIGN PATENT DOCUMENTS

| EP | 1 278 249 | * | 1/2003 | ........... H01L/33/00 |
|----|-----------|---|--------|----------------------|
| GB | 2 343 994 A | | 5/2000 | |
| GB | 2 343 994 | * | 5/2000 | ........... H01L/33/00 |
| JP | 5-335622 | | 12/1993 | |
| JP | 6-237012 | | 8/1994 | |
| JP | 6-268258 | | 9/1994 | |
| JP | 7-30153 | | 1/1995 | |
| JP | 7-254732 | | 10/1995 | |
| JP | 8-102550 | | 4/1996 | |
| JP | 8-340131 | | 12/1996 | |
| JP | 9-97922 | | 4/1997 | |
| JP | 9-320984 | | 12/1997 | |
| JP | 10-117017 | | 5/1998 | |
| JP | 10-163531 | | 6/1998 | |
| JP | 10-209493 | | 8/1998 | |
| JP | 10-209496 | | 8/1998 | |
| JP | 10-256602 | | 9/1998 | |
| JP | 10-275934 | | 10/1998 | |
| JP | 10-275935 | | 10/1998 | |
| JP | 2000-22210 | | 1/2000 | |
| JP | 2000-164930 | | 6/2000 | |

* cited by examiner

Primary Examiner—David Nelms
Assistant Examiner—Dao H. Nguyen
(74) Attorney, Agent, or Firm—McGinn & Gibb, PLLC

(57) ABSTRACT

An object of the present invention is to provide a large-size light-emitting device from which uniform light emission can be obtained.

That is, in the present invention, in a device having an outermost diameter of not smaller than 700 μm, a distance from an n electrode to a farthest point of a p electrode is selected to be not larger than 500 μm.

12 Claims, 24 Drawing Sheets

GROUP-III NITRIDE COMPOUND SEMICONDUCTOR DEVICE

TECHNICAL FIELD

The present invention relates to a Group III nitride compound semiconductor device. The invention is adapted for improvement in electrodes of a Group III nitride compound semiconductor light-emitting device such as a blue light-emitting diode.

BACKGROUND ART

In a Group III nitride compound semiconductor light-emitting device such as a blue light-emitting diode, various proposals have been made for obtaining uniform light emission from the whole surface of the device.

For example, in Unexamined Japanese Patent Publication No. Hei. 8-340131 and Unexamined Japanese Patent Publication No. Hei. 10-117017, a p auxiliary electrode is provided radially on an upper surface of a p contact layer to attain uniformity of electric current density injected into the p contact layer. On the other hand, for example, as described in Unexamined Japanese Patent Publication No. 10-275934, a translucent electrode may be stuck on an upper surface of a p-type contact layer so that a p seat electrode is provided thereon. In this example, a p auxiliary electrode is extended from the p seat electrode along sides of the device.

Unexamined Japanese Patent Publication No. Hei. 9-97922 and Unexamined Japanese Patent Publication No. 2000-22210 have disclosed the case where an n auxiliary electrode is provided along sides of the device from an n seat electrode formed in a corner portion of the device, by way of example.

Unexamined Japanese Patent Publication No. 2000-164930 has disclosed a comb-like electrode.

According to the present inventors' examination, it has been found that it is preferable to increase the chip size of light-emitting diodes used in a signal or the like in which high luminance is demanded and light-emitting diodes of one color are collectively used. This is because if the number of light-emitting diodes used can be reduced by increase in chip size, a circuit for evenly distributing an electric current to respective light-emitting diodes can be designed easily and simply as well as the number of steps for assembling the light-emitting diodes can be reduced to attain reduction in production cost.

Therefore, the inventors have made examination again and again to increase the chip size of light-emitting diodes. As a result, the following problems have been found.

Since the resistance of an n contact layer (a layer on which an n electrode is formed) in a light-emitting diode is relatively high, an electric current cannot sufficiently go around to a portion far from the n electrode so that light emission is reduced in the portion. On the other hand, intensive light emission is obtained in a portion near the n electrode, so that light emission becomes uneven on the whole of the device. In a conventional small-size device (300 to 400 $\mu m\square$) viewed from this point, the portion far from the n electrode was more or less dark, but was limited to a very small area so that the unevenness of light emission was substantially not a large obstacle.

If the chip size becomes large, the amount of an electric current applied to the p seat electrode must be increased when preferable current density injected per unit light-emitting area is to be kept. The current applied to the p seat electrode flows from the p seat electrode into the translucent electrode. If the amount of the current becomes large, there is a high possibility that burning (burning off the translucent electrode in a joint portion by generated Joule heat) may occur between the p seat electrode and the translucent electrode. The area of an interface between the p seat electrode and the translucent electrode is a factor for deciding the amount of the current (permissible current quantity) permitted to be injected into the p seat electrode. It is conceived that the permissible current quantity can increase as the area increases.

If one p seat electrode and one n seat electrode are used in combination when preferred current density is to be secured in an effective light-emitting surface of a large-size chip having an outermost diameter of not smaller than 700 $\mu m$, there is a fear that mold resin may be burned by heat generated in a bonding wire portion or the bonding wire itself may be broken by heat unfavorably.

DISCLOSURE OF THE INVENTION

The invention is provided to solve at least one of the aforementioned problems. That is, in the present invention, there is provided a Group III nitride compound semiconductor device which is a device having an outermost diameter of not smaller than 700 $\mu m$, wherein a distance from an n electrode to a farthest point of a p electrode is not larger than 500 $\mu m$.

According to the Group III nitride compound semiconductor device configured as described above, the farthest point of the p electrode from the n electrode is within the aforementioned distance. Hence, even in the case where the resistance of an n-type semiconductor layer is high, electrons are sufficiently injected into the farthest device portion from the n electrode (electric current is diffused). As a result, light is emitted more evenly from the whole surface of the device.

Incidentally, the current density and the luminous output of the light-emitting device have such relation that the luminous output is saturated when the current density exceeds a predetermined value. That is, even in the case where current density exceeding the predetermined value is injected, it is impossible to obtain increase in the luminous output in accordance with the current density. It is therefore preferable that current density near the predetermined value is achieved on the whole region of the device in order to achieve both high luminous output and high luminous efficiency. When the distance between the n electrode and the p electrode is defined as in the invention, the preferred current density can be obtained on the whole region of the device and, accordingly, a device excellent in luminous efficiency can be provided.

Incidentally, in this specification, the n electrode has an n seat electrode, and an n auxiliary electrode extended from then seat electrode whereas the p electrode has a p seat electrode, and a p auxiliary electrode extended from the p seat electrode. The outermost diameter of the device is the length of the longest one of lines allowed to be drawn on the device in a plan view of the device. When the device is rectangular, the outermost diameter of the device is the length of a diagonal line. When the device is rhombic, the outermost diameter of the device is likewise the length of a diagonal line. When the device is circular or elliptic, the outermost diameter of the device is the length of a line passing through the center of a circle or ellipse. As described above, the shape of the device is not particularly limited. Besides the aforementioned shapes, polygonal shapes such as a hexagonal shape, an octagonal shape, etc. may be used as the device shapes.

The upper limit of the distance between the n electrode and the p electrode located farthest from the n electrode is selected to be more preferably 400 μm, further more preferably 350 μm.

In the case of a rectangular chip, such configuration is preferably applied to a chip having a length of 500 μm or more on one side (700 μm or more in outermost diameter). In a conventional n electrode configuration, if the chip size becomes large as described above, there is fear that a portion which is darkened because it is too far from the n electrode to obtain sufficient current density may form an unacceptably large region, and that the region may appear in the central portion of the device to make the luminous form unsuitable. In the case of a rectangular chip, the length of a side is selected to be more preferably not smaller than 600 μm, further more preferably not smaller than 700 μm, most preferably not smaller than 800 μm.

In an aspect of the invention, configuration that the n auxiliary electrode is extended from the n seat electrode to the central portion of the device is used so that the distance between any point of the p electrode and the n electrode can be selected to be in the predetermined range.

Since the n auxiliary electrode is present in the central portion of the device, the distance from the n auxiliary electrode to any corner portion of the device is kept constant. Hence, reduction in luminous output from the corner portions can be prevented.

When the n electrode has been improved in the aforementioned manner to secure uniform diffusion of current to the n-type semiconductor layer, the next problem has loomed up newly.

Also in the type in which a translucent electrode is stuck on a p-type semiconductor layer to attain diffusion of current, if the chip size is made so large that the distance from the p seat electrode or from the p auxiliary electrode becomes large, the resistance of the translucent electrode itself as a thin film cannot be ignored so that an electric current cannot be sufficiently injected into a far portion of the p-type semiconductor layer from the p seat electrode or from the p auxiliary electrode.

In an aspect of the invention, therefore, the distance from any point on the translucent electrode to the p seat electrode or the p auxiliary electrode is selected to be in a range of from 0 to 1000 μm.

According to the Group III nitride compound semiconductor device configured thus, all points of the translucent electrode are within the aforementioned distance from the p seat electrode or from the p auxiliary electrode. Hence, an electric current can be sufficiently diffused to the farthest portion of the translucent electrode from the p seat electrode or from the p auxiliary electrode so as to be injected into the p-type semiconductor layer just under the translucent electrode. As a result, light can be emitted substantially evenly from the whole surface of the device. The upper limit of the distance between any point on the translucent electrode and either of the p seat electrode and the p auxiliary electrode is selected to be more preferably 500 μm, further more preferably 450 μm, further further more preferably 400 μm, most preferably 350 μm.

In the case of a rectangular chip, such configuration is preferably applied to a chip having a length of 500 μm or more on one side (700 μm or more in outermost diameter). In a conventional p electrode configuration, if the chip size becomes large as described above, there is fear that a portion which is darkened because it is too far from the p electrode to obtain sufficient current density may form an unacceptably large region, and that the portion may appear in the center of the device to make the luminous form unsuitable. In the case of a rectangular chip, the length of a side is selected to be more preferably not smaller than 600 μm, further more preferably not smaller than 700 μm, most preferably not smaller than 800 μm.

In this manner, in an aspect of the invention, configuration in which the p auxiliary electrode is extended from the p seat electrode to the central portion of the translucent electrode is used so that the distance from any point on the translucent electrode to the p seat electrode or the p auxiliary electrode can be selected to be in the predetermined range.

Since the p auxiliary electrode is present in the central portion of the translucent electrode, the distance from the p auxiliary electrode to any corner portion of the translucent electrode is kept constant. Hence, reduction in luminous output from the corner portions can be prevented.

In the Group III nitride compound semiconductor device having both the n electrode and the p electrode configured as described above, it is preferable that then auxiliary electrode and the p auxiliary electrode are arranged like a comb in a plan view of the device. The device does not operate (the device does not emit light when the device is a light-emitting device) in certain portions of the n auxiliary electrode and the p auxiliary electrode. Hence, when the n auxiliary electrode and the p auxiliary electrode are arranged like a comb, the inoperative portions can be disposed as symmetrical or regular patterns in the device, so that the device can be used easily. In the case of a light-emitting device, light can be taken out evenly.

In the Group III nitride compound semiconductor device having both the n electrode and the p electrode configured as described above, it is preferable that then auxiliary electrode and the p auxiliary electrode include portions arranged in parallel with each other in a plan view of the device. The device does not operate (the device does not emit light when the device is a light-emitting device) in certain portions of the n auxiliary electrode and the p auxiliary electrode. Hence, when the parallel portions are disposed, the inoperative portions can be disposed as symmetrical or regular patterns in the device, so that the device can be used easily. In the case of a light-emitting device, light can be taken out evenly.

As the chip size increases, electric power consumed by the device increases, and the current applied between the seat electrodes accordingly increases. If one seat electrode is provided on each of p and n sides as in the conventional case, there may occur a problem that the mold resin is burned off by heat generated in the bonding wire portion or that the bonding wire itself is broken by the heat. Therefore, in another aspect of the invention, a plurality of p seat electrodes and a plurality of n seat electrodes are provided. As a result, the aforementioned problem is solved.

In the case of a rectangular chip, the preferred chip size for the provision of the plurality of p seat electrodes and the plurality of n seat electrodes is such that the length of a side is not smaller than 500 μm (the outermost diameter is not smaller than 700 μm). The length of a side is selected to be more preferably not smaller than 600 μm, further more preferably not smaller than 700 μm, most preferably not smaller than 800 μm.

If the electric power consumed by the light-emitting device increases because of increase in the chip size of the light-emitting device, there arises a problem of burning between the p seat electrode and the translucent electrode in addition to the aforementioned problem. It is therefore preferable that a p auxiliary electrode is provided to extend from the p seat electrode. When the p auxiliary electrode is provided, a sufficient area can be obtained between the p seat electrode and the translucent electrode and between the p auxiliary electrode and the translucent electrode to thereby prevent occurrence of the burning. Hence, the amount of current (permissible current quantity) allowed to be applied to the p seat electrode increases, so that the amount of current required for emitting light from the whole surface of the device can be kept sufficiently.

Figure 1:
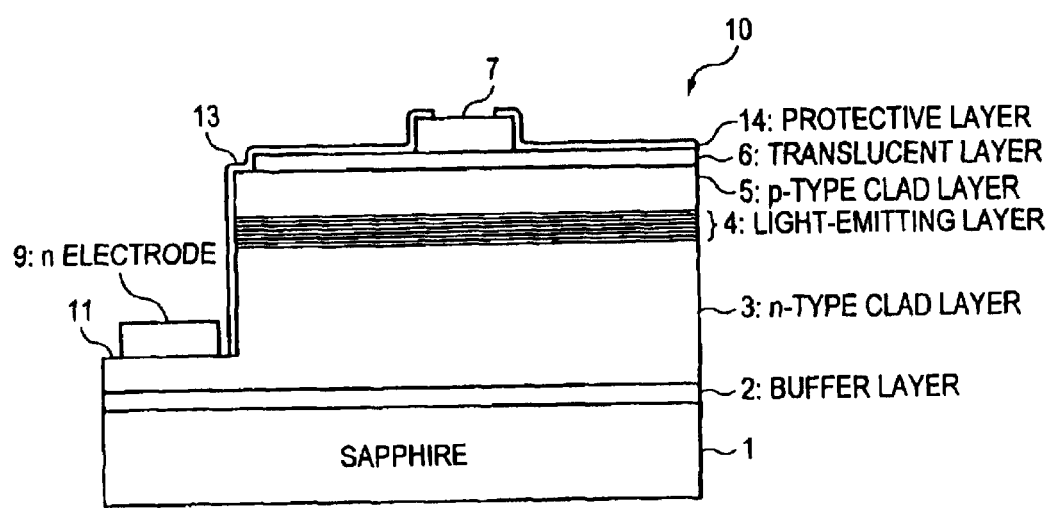
FIG. 1 explains the layer structure of a light-emitting device according to an embodiment of the invention.

In the drawings, the reference numerals 10, 23, 33, 43, 43-1, 53, 63, 303 and 301-1 designate light-emitting devices;

6, 16, 26, 36, 46, 56, 66 and 306 designate translucent electrodes;

7 designates a p electrode;

9 designates an n electrode;

17, 27, 37, 47, 57, 81, 91, 101, 111, 121, 131, 141, 151, 161, 171, 181, 191, 201, 211, 221, 231, 241 and 251 designate p seat electrodes;

18, 28, 38, 48, 58, 82, 92, 93, 102, 112, 122, 123, 132, 133, 142, 143, 152, 166, 172, 182, 192, 193, 202, 212, 222, 223, 233, 2-32, 242, 242, 252 designate p auxiliary electrodes;

19, 29, 39, 49, 59, 85, 95, 105, 115, 125, 135, 145, 155, 165, 175, 185, 195, 205, 215, 225, 235, 245 and 255 designate n seat electrodes; and 20, 30, 40, 50, 60, 70, 86, 96, 106, 107, 116, 126, 127, 136, 137, 146, 156, 166, 176, 186, 196, 216, 226, 227, 236, 237, 246, 247, 248, 256, 310 and 320 designate n auxiliary electrodes.

BEST MODE FOR CARRYING OUT THE INVENTION

Respective members constituting the invention will be described below in detail taking a Group III nitride compound semiconductor light-emitting device as an example.

An n electrode is formed on an n contact layer revealed by etching a semiconductor layer. Although any material can be selected as the material of the n electrode if ohmic contact can be obtained between this material and the p-type Group III nitride compound semiconductor, an aluminum alloy such as a vanadium-aluminum alloy is preferably used.

The shape of then electrode is also optional. According to an aspect of the invention, a combination of an n seat electrode and an n auxiliary electrode extended from the n seat electrode may be preferably used as the n electrode so that the distance from any point of a p electrode to the n electrode is selected to be in a predetermined range. The n seat electrode may be disposed in substantially the central portion of a side of the device or may be disposed in a corner portion of the device. Preferably, the n auxiliary electrode has a portion extended from the n seat electrode to the central portion of the device.

It is preferable from the point of view of reduction in the number of steps that the n auxiliary electrode is made of the same material by the same method (same mask) as the n seat electrode. In this case, the thickness of the n auxiliary electrode is selected to be equal to that of then seat electrode.

The n auxiliary electrode and the n seat electrode may be formed separately. In this case, the material and thickness of the n auxiliary electrode may be selected to be different from those of the n seat electrode.

The shape of the n seat electrode is not particularly limited if the n seat electrode has an area sufficient to bond electrically conductive wire thereto by a known method.

Since the n auxiliary electrode is formed on a portion where the semiconductor layer is removed, it is preferable that the width of the n auxiliary electrode is narrowed from the point of view of locally maximizing the effective area of the semiconductor layer. The width of the n auxiliary electrode is preferably selected to be in a range of from 1 to 40 $\mu$m, more preferably in a range of from 2 to 30 $\mu$m, further more preferably in a range of from 3 to 25 $\mu$m, further further more preferably in a range of from 3 to 20 $\mu$m, most preferably in a range of from 5 to 15 $\mu$m.

The material for forming the translucent electrode is not particularly limited. For example, a Co layer as a first electrode layer and an Au layer as a second electrode layer are successively laminated from the lower side.

It is preferable that the constituent element of the first electrode layer is lower in ionization potential than the constituent element of the second electrode layer, and that the constituent element of the second electrode layer is set as an element better in ohmic characteristic to semiconductor than the constituent element of the first electrode layer. A heat treatment is also applied to the electrode layers for forming an alloy with a p-type contact layer. By the heat treatment, the element distribution in the depthwise direction from a surface of the semiconductor becomes a distribution in which the constituent element of the second electrode layer penetrates more deeply than the constituent element of the first electrode layer. That is, the element distribution of the electrode layers is reversed to the distribution at the time of the formation of the electrode layers. After the formation of the electrode layers, the constituent element of the second electrode layer formed on the upper side is migrated to the lower side whereas the constituent element of the first electrode layer formed on the lower side is migrated to the upper side.

Preferably, the constituent element of the first electrode layer is at least one element selected from the group consisting of nickel (Ni), cobalt (Co), iron (Fe), copper (Cu), chromium (Cr), tantalum (Ta), vanadium (V), manganese (Mn), aluminum (Al) and silver (Ag). The thickness of the first electrode layer is selected to be in a range of from 0.5 to 15 nm. The constituent element of the second electrode layer is at least one element selected from the group consisting of palladium (Pd), gold (Au), iridium (Ir) and platinum (Pt). The thickness of the second electrode layer is selected to be in a range of from 3.5 to 25 nm. Most preferably, the constituent element of the first electrode layer is Co and the constituent element of the second electrode layer is Au. In this case, by the heat treatment, the element distribution in the depthwise direction from the surface of the semiconductor becomes a distribution in which Au penetrates more deeply than Co.

The material for forming the p seat electrode is not particularly limited too. For example, the p seat electrode is formed as a structure in which a V layer as a first metal layer, an Au layer as a second metal layer and an Al layer as a third metal layer are successively laminated from the lower side.

The element of the first metal layer is selected to be lower in ionization potential than that of the second metal layer so that the first metal layer can be firmly bonded to a layer under the first metal layer. The element of the second metal layer is selected to be good in bonding characteristic to Al or Au and nonreactive to the translucent electrode. The element of the third metal layer is preferably selected to be an element capable of being firmly bonded to a protective film.

Preferably, the constituent element of the first metal layer is at least one element selected from the group consisting of nickel (Ni), iron (Fe), copper (Cu), chromium (Cr), tantalum (Ta), vanadium (V), manganese (Mn) and cobalt (Co). The thickness of the first metal layer is selected to be in a range of from 1 to 300 nm.

Preferably, the constituent element of the third metal layer is at least one element selected from the group consisting of aluminum (Al), nickel (Ni) and titanium (Ti). The thickness of the third metal layer is selected to be in a range of from 1 to 30 nm.

Preferably, the constituent element of the second metal layer is gold (Au). The thickness of the second metal layer is selected to be in a range of from 0.3 to 3 $\mu$m.

It is preferable from the point of view of reduction in the number of steps that the p auxiliary electrode is made of the same material by the same method (same mask) as the p seat electrode. In this case, the thickness of the p auxiliary electrode is selected to be equal to that of the p seat electrode.

The p auxiliary electrode and the p seat electrode may be formed separately. In this case, the material and thickness of the p auxiliary electrode may be selected to be different from those of the p seat electrode.

The shape of the p seat electrode is not particularly limited if the p seat electrode has an area sufficient to bond electrically conductive wire thereto by a known method. Preferably, the shape of the p seat electrode different from that of the n seat electrode is used so that positions can be confirmed at the time of bonding.

Since the p auxiliary electrode shields light, the width of the p auxiliary electrode is preferably narrowed. The width of the p auxiliary electrode is preferably selected to be in a range of from 1 to 40 $\mu$m, more preferably in a range of from 2 to 30 $\mu$m, further more preferably in a range of from 3 to 25 $\mu$m, further further more preferably in a range of from 3 to 20 $\mu$m, most preferably in a range of from 5 to 15 $\mu$m.

Preferably, irregularities may be provided around the p seat electrode and/or the p auxiliary electrode to increase the contact area between the translucent electrode and the p seat electrode and/or between the translucent electrode and the p auxiliary electrode.

The circumferential surface of the p seat electrode is preferably inclined. When the circumferential surface of the seat electrode is tapered, a protective film (such as an $SiO_2$ film) formed on surfaces of the seat electrode and the translucent electrode can be also formed on the tapered portion so that the protective film has the substantially same film thickness as designed.

A combination of the p seat electrode and the p auxiliary electrode extended from the p seat electrode is preferably used so that the distance from any point of the translucent electrode to the p seat electrode or the p auxiliary electrode can be selected to be in a predetermined range. The p seat electrode may be disposed in substantially the central portion of one side of the device or may be disposed in a corner portion of the device.

Preferably, the p auxiliary electrode is formed like a comb with respect to the n auxiliary electrode. Here, the term "comb" means a state in which the p auxiliary electrode and the n auxiliary electrode are disposed alternately in a plan view of the device.

Preferably, the p auxiliary electrode has a portion disposed in parallel with the n auxiliary electrode.

Preferably, the heat treatment for alloying the translucent electrode with the p seat electrode and the p auxiliary electrode is carried out in oxygen-containing gas. In this case, as the oxygen-containing gas, it is possible to use a gas of at least one member or a mixture gas selected from the group consisting of $O_2$, $O_3$, CO, $CO_2$, NO, $N_2O$, $NO_2$ and $H_2O$. Or it is possible to use a mixture gas of an inert gas and at least one member selected from the group consisting of $O_2$, $O_3$, CO, $CO_2$, NO, $N_2O$, $NO_2$ and $H_2O$. Or it is possible to use a mixture gas of an inert gas and a mixture gas selected from the group consisting of $O_2$, $O_3$, CO, $CO_2$, NO, $N_2O$, $NO_2$ and $H_2O$. In short, the oxygen-containing gas means gas of oxygen atoms or molecules containing oxygen atoms.

Any atmospheric pressure may be used in the heat treatment if the atmospheric pressure is not smaller than the pressure in which gallium nitride compound semiconductor is not thermally decomposed at the heat treatment temperature. When only $O_2$ gas is used as the oxygen-containing gas, the oxygen-containing gas may be introduced with pressure of not smaller than the pressure of decomposition of the gallium nitride compound semiconductor. When a mixture gas of $O_2$ gas and another inert gas is used as the oxygen-containing gas, it will be sufficient if the total pressure of the mixture gas is made not smaller than the pressure of decomposition of the gallium nitride compound semiconductor and the ratio of the amount of the $O_2$ gas to the total amount of the mixture gas is not smaller than about $10^{-6}$. In short, it will be sufficient if a very small amount of oxygen-containing gas is provided. Incidentally, the upper limit value of the amount of the oxygen-containing gas introduced is not particularly limited by characteristic of p-type resistance reduction and electrode alloying. In short, any amount of the oxygen-containing gas introduced may be used if production can be made.

Most preferably, the temperature used in the heat treatment is in a range of from 500 to 600° C. A low-resistance p-type gallium nitride compound semiconductor with an entirely saturated resistivity can be obtained at a temperature not lower than 500° C. On the other hand, the electrode can be alloyed well at a temperature not higher than 600° C. The preferred temperature range is from 450 to 650° C.

As for materials for forming the p seat electrode, the p auxiliary electrode and the translucent electrode and heat-treating conditions therefor, refer to Unexamined Japanese Patent Publication No. Hei. 9-320984 and Unexamined Japanese Patent Publication No. Hei. 10-209493.

In this description, each of group III nitride compound semiconductors is represented by the general formula:

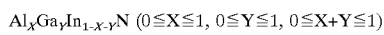

$Al_XGa_YIn_{1-X-Y}N$ ($0 \leq X \leq 1$, $0 \leq Y \leq 1$, $0 \leq X+Y \leq 1$)

which includes so-called binary compounds such as AlN, GaN and InN, and so-called ternary compounds such as $Al_xGa_{1-x}N$, $Al_xIn_{1-x}N$ and $Ga_xIn_{1-x}N$ ($0<x<1$ in the above). The group III elements may be partially replaced by boron (B), thallium (Tl), or the like. Further, the nitrogen (N) may be partially replaced by phosphorus (P), arsenic (As), antimony (Sb), bismuth (Bi), or the like. The group III nitride compound semiconductor layer may contain an optional dopant. Si, Ge, Se, Te, C, or the like, can be used as n-type impurities. Mg, Zn, Be, Ca, Sr, Ba, or the like, can be used as p-type impurities. Incidentally, after doped with p-type impurities, the group III nitride compound semiconductor may be irradiated with electron beams or plasma or heated in a furnace. The method of forming each group III nitride compound semiconductor layer is not particularly limited. For example, besides a metal organic chemical vapor deposition method (MOCVD method), the group III nitride compound semiconductor layer may be formed by a known method such as a molecular beam epitaxy method (MBE method), a halide vapor phase epitaxy method (HVPE method), a sputtering method, an ion-plating method, an electron showering method, etc.

Examples of the Group III nitride compound semiconductor device include: optical devices such as a light-emitting diode, a light-receiving diode, a laser diode, a solar cell, etc.; bipolar devices such as a rectifier, a thyristor, a transistor, etc.; unipolar devices such as an FET, etc.; and electronic devices such as a microwave device, etc. The present invention may be applied also to laminates which are intermediates of these devices.

Incidentally, a homo structure, a hetero structure or a double hetero structure provided with an MIS junction, a PIN junction or a p-n junction can be used as the structure of the light-emitting device. A quantum well structure (single quantum well structure or multiple quantum well structure) may be used as the light-emitting layer.

<Embodiments>

An embodiment of the invention will be described below.

This embodiment shows a light-emitting diode 10. FIG. 1 shows the configuration thereof. Incidentally, FIG. 1 is a view not for exactly reflecting the thickness and width proportion of respective layers but for explaining the configuration of the layers.

| Layer | Composition | Dopant | (Thickness) |
|---|---|---|---|
| Protective layer 14 | SiO$_2$ | | (0.3 μm) |
| Translucent electrode 6 | Au (6 nm)/Co (1.5 nm) | | |
| p-type clad layer 5 | p-GaN | Mg | (0.3 μm) |
| Light-emitting layer 4 | Superlattice structure | | |
| Quantum well layer | In$_{0.15}$Ga$_{0.85}$N | | (3.5 nm) |
| Barrier layer | GaN | | (3.5 nm) |
| The number of repeated quantum well and barrier layers: 1 to 10 | | | |
| n-type clad layer 3 | n-GaN | Si | (4 μm) |
| AlN buffer layer 2 | AlN | | (60 nm) |
| Substrate 1 | Sapphire (surface a) | | (300 μm) |

The n-type clad layer 3 may be of a double-layered structure having an n− layer of low electron density on the light-emitting layer 4 side and an n+ layer of high electron density on the buffer layer 2 side. The latter is called n-type contact layer.

The light-emitting layer 4 is not limited to the superlattice structure. A single hetero type structure, a double hetero type structure, a homo junction type structure, or the like, may be used as the structure of the light-emitting device.

A group III nitride compound semiconductor layer doped with an acceptor such as magnesium and having a wide band gap may be interposed between the light-emitting layer 4 and the p-type clad layer 5. This is provided for preventing electrons injected into the light-emitting layer 4 from dispersing into the p-type clad layer 5.

The p-type clad layer 5 may be of a double-layered structure having a p− layer of low hole density on the light-emitting layer 4 side and a p+ layer of high hole density on the electrode side. The latter is called p-type contact layer.

In the light-emitting diode configured as described above, each of the group III nitride compound semiconductor layers is formed by execution of MOCVD under a general condition.

Then, a mask is formed and the p-type clad layer 5, the active layer 4 and the n-type clad layer 3 are partially removed by reactive ion etching to thereby reveal an n electrode-forming surface 11 on which an n electrode 9 will be formed.

A Co layer (1.5 nm) and an Au layer (60 nm) are successively laminated onto the whole surface of a wafer by an evaporation system. Next, a photo resist is applied thereon evenly and then removed from the n electrode-forming surface 11 and a portion (clearance region 13) about 10 μm wide from its circumference by photolithography. The translucent electrode-forming material is removed from this portion by etching to thereby reveal the semiconductor layer. Then, the photo resist is removed.

Then, a V layer (17.5 nm), an Au layer (1.5 μm) and an Al layer (10 nm) are successively deposited and laminated by a lift-off method to thereby form a p seat electrode 7 and a p auxiliary electrode 7 (p electrode 7).

An n electrode 9 made of vanadium and aluminum is also formed by a lift-off method.

The sample obtained in the aforementioned manner is put into a heating furnace. The inside of the furnace is evacuated to be not higher than 1 Pa. Then, O$_2$ is fed to the furnace so that the degree of vacuum reaches ten and several Pa. In this condition, the temperature of the furnace is set at 550° C. and heating is performed for about 4 minutes. Thus, the material of the translucent electrode 6 and the materials of the p seat electrode and the p auxiliary electrode are alloyed and connected to each other to thereby form a p electrode.

According to the inventors' examination, there is little electric current injected into the p-type clad layer just under the p seat electrode and the p auxiliary electrode. It is anticipated that contact resistance is relatively high just under the p seat electrode and the p auxiliary electrode because the aforementioned inversion of the distribution does not occur in the Au/Co deposited layers constituting the translucent electrode. Hence, the interface between the circumferential surface of the p seat/auxiliary electrode and the translucent electrode 6 becomes an electrical connection surface effective to the two. That is, the electric current applied to the p seat electrode flows into the translucent electrode through the circumferential surface of the p seat/auxiliary electrode and diffuses into the whole surface of the translucent electrode, so that the current is injected into the whole surface of the p-type semiconductor layer evenly.

The substantially whole surface except a region provided on the p seat electrode to be subjected to wire bonding or the like and the upper surface and circumferential edge portion of the n electrode is covered with an electrically insulating translucent protective film 14 (silicon oxide, silicon nitride, titanium oxide, aluminum oxide, or the like). A sputtering method or a CVD method can be used as a method for forming the protective film 14.

Figure 2:
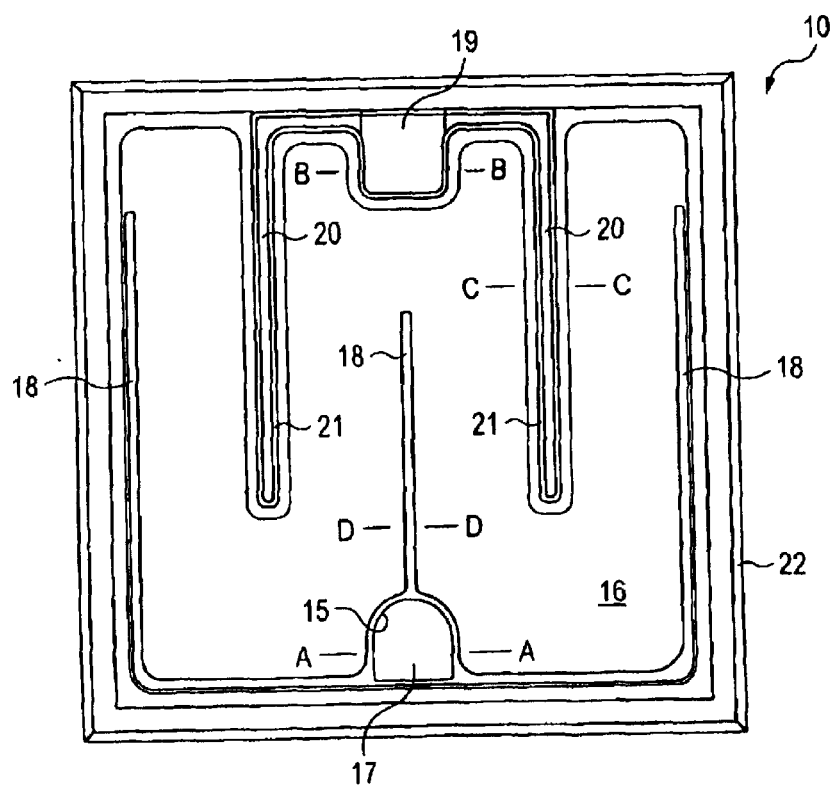
FIG. 2 is a plan view showing an example of arrangement of electrodes in the light-emitting device according to this embodiment.
Figure 3:
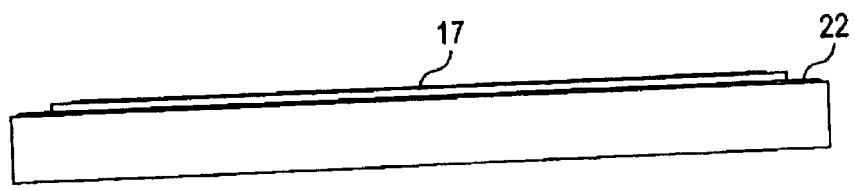
FIG. 3 is a front view showing this example.
Figure 4:
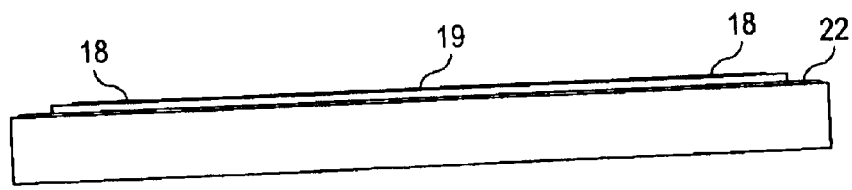
FIG. 4 is a back view showing this example.
Figure 5:
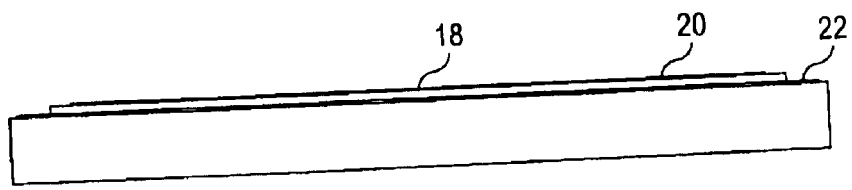
FIG. 5 is a left (right) side view showing this example.
Figure 6:
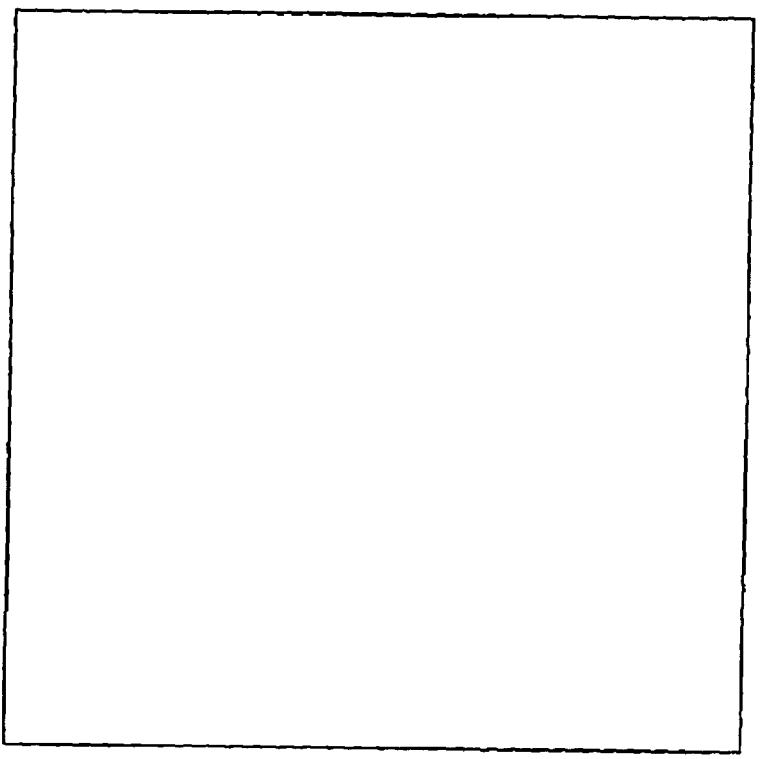
FIG. 6 is a bottom view showing this example.
Figure 7:
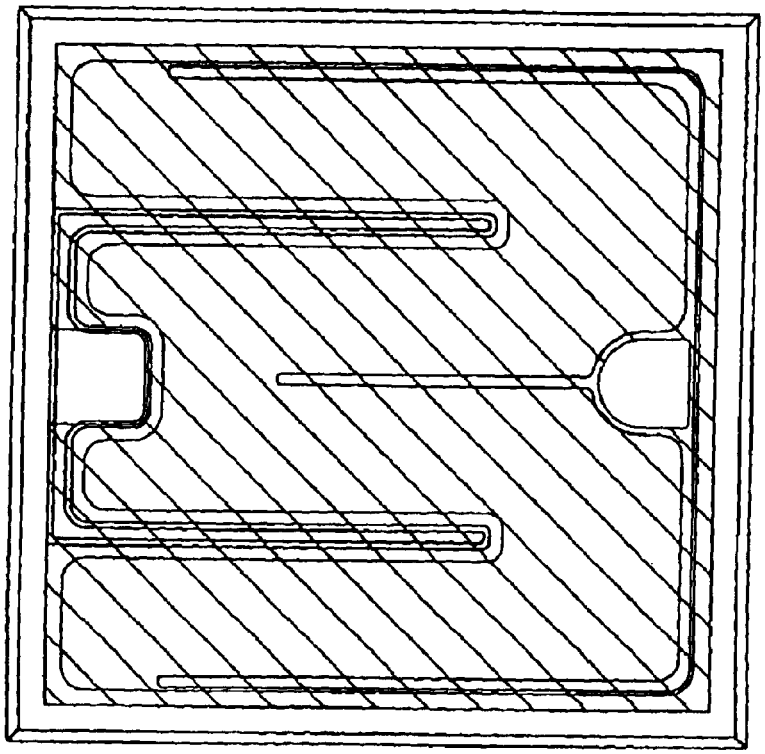
FIG. 7 is a reference plan view showing a transparent portion (transparent electrode)
Figure 8:
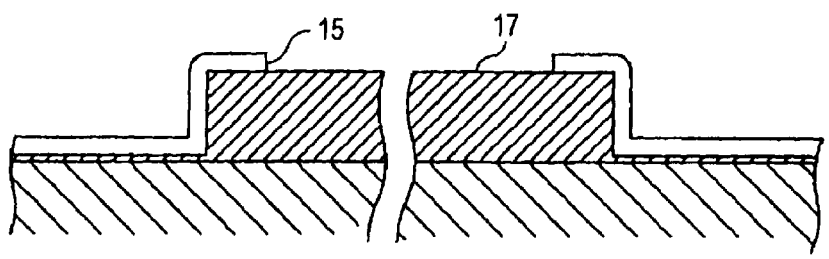
FIG. 8 is a partly cutaway enlarged sectional view taken long the line A—A in FIG. 2.
Figure 9:
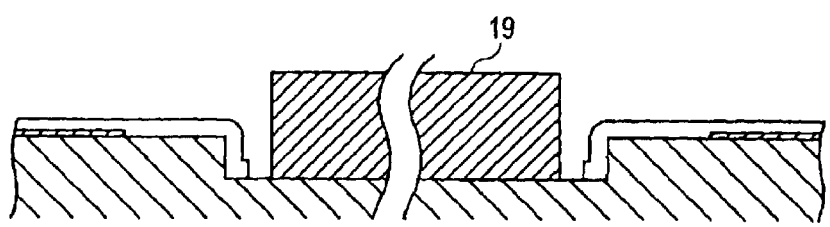
FIG. 9 is a partly cutaway enlarged sectional view taken long the line B—B in FIG. 2.
Figure 10:
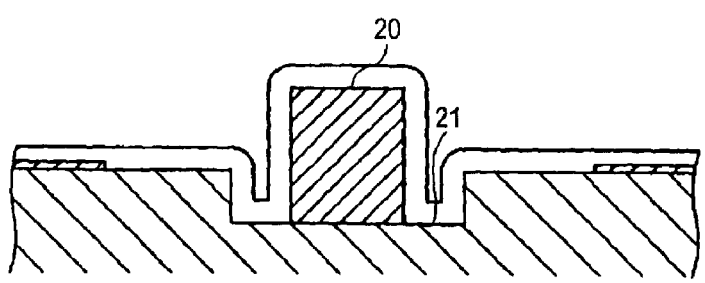
FIG. 10 is an enlarged sectional view taken long the line C—C in FIG. 2.
Figure 11:
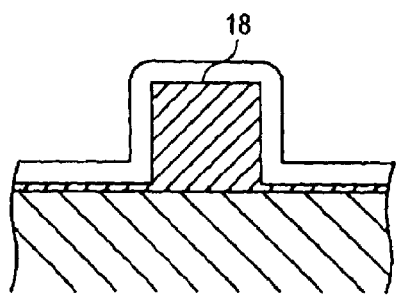
FIG. 11 is an enlarged sectional view taken long the line D—D in FIG. 2.

An example of arrangement of electrodes in the light-emitting device 10 obtained in the aforementioned manner is shown in FIGS. 2 to 11. In FIG. 2, the reference numeral 16 designates a translucent electrode; 17, a p seat electrode; and 18, a p auxiliary electrode. The p auxiliary electrode 18 is formed so as to be integrated with the p seat electrode 17. The p seat electrode 17 is disposed in the center of a side so that the p auxiliary electrode 18 is shaped like an E figure opened upward with the p seat electrode 17 as its center. The reference numeral 15 designates a parting line for the protective film.

An n seat electrode 19 is formed in substantially the center of a side opposite to the p seat electrode 17. An n auxiliary electrode 20 is formed so as to be integrated with the n seat electrode 19. The n auxiliary electrode 20 is shaped like a U figure opened downward with the n seat electrode as its center. The n auxiliary electrode 20 is disposed so as to be parallel with the p auxiliary electrode 18 and shaped like a comb.

The reference numeral 21 designates an n electrode-forming surface; and 22, a substrate material surface which is revealed for dicing. The protective film 24 is a portion hatched in FIG. 7.

The device is a square having a length of 1000 µm on each side.

Figure 12:
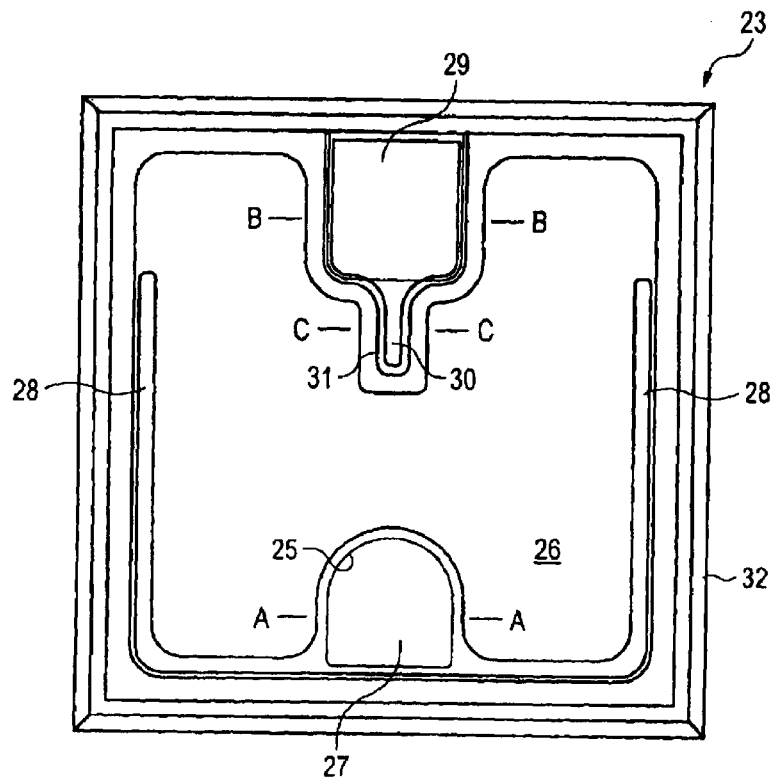
FIG. 12 is a plan view showing an example of arrangement of electrodes in a light-emitting device according to another embodiment of the invention.
Figure 13:
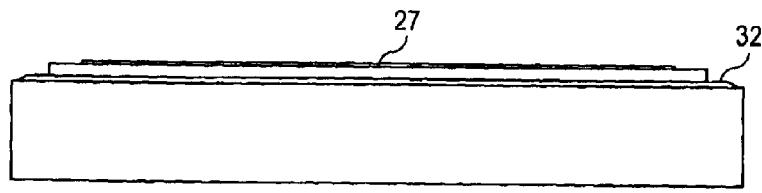
FIG. 13 is a front view showing this example.
Figure 14:
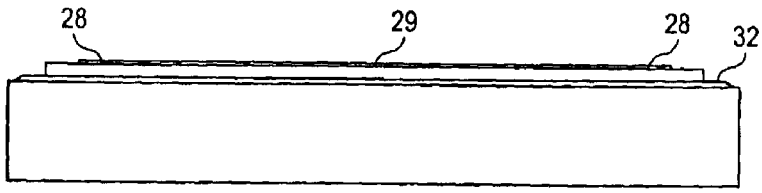
FIG. 14 is a back view showing this example.
Figure 15:
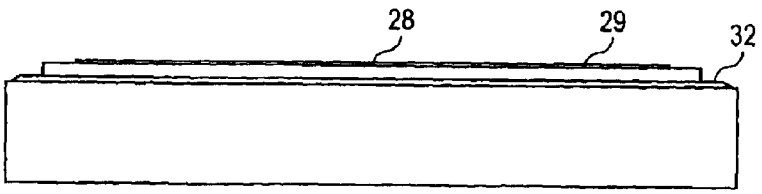
FIG. 15 is a left (right) side view showing this example.
Figure 16:
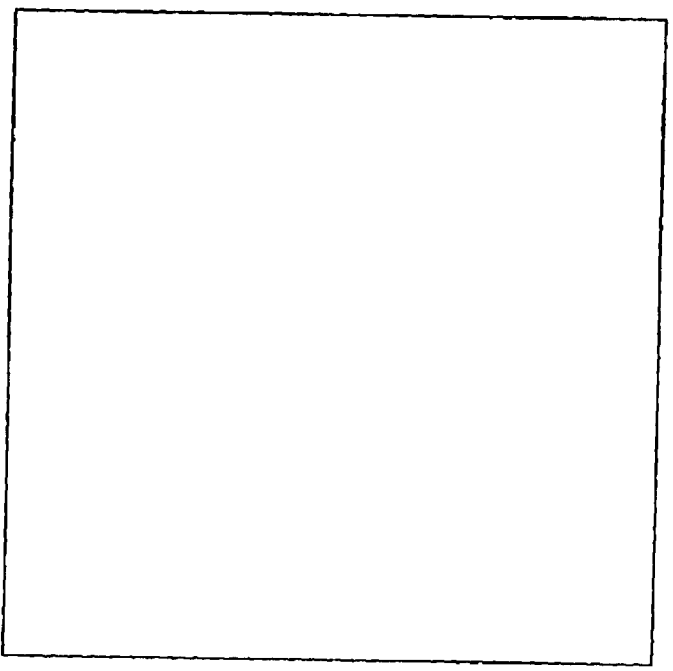
FIG. 16 is a bottom view showing this example.
Figure 17:
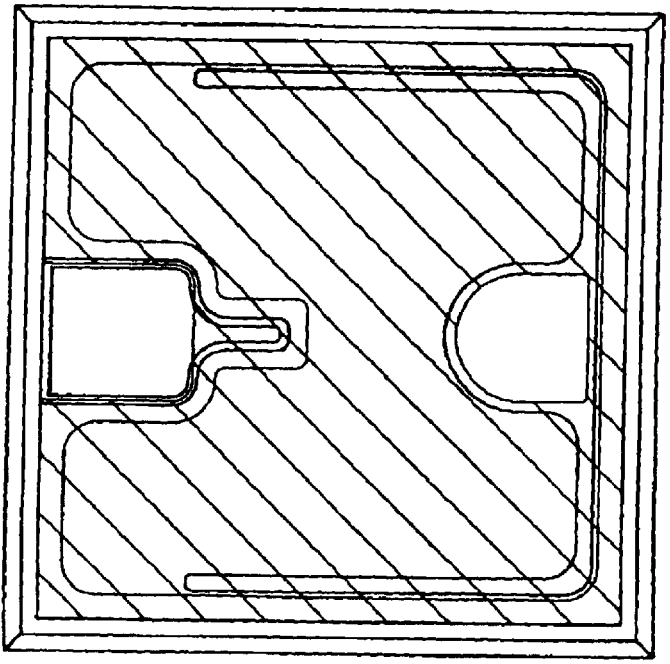
FIG. 17 is a reference plan view showing a transparent portion (transparent electrode)
Figure 18:
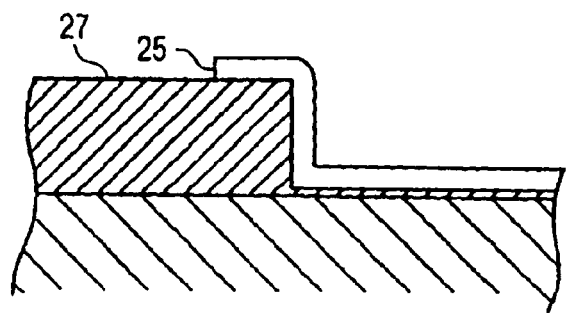
FIG. 18 is a partly cutaway enlarged sectional view taken long the line A—A in FIG. 12.
Figure 19:
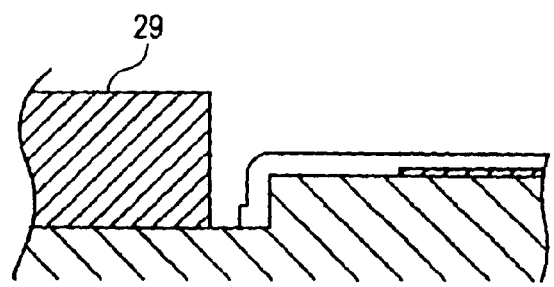
FIG. 19 is a partly cutaway enlarged sectional view taken long the line B—B in FIG. 12.
Figure 20:
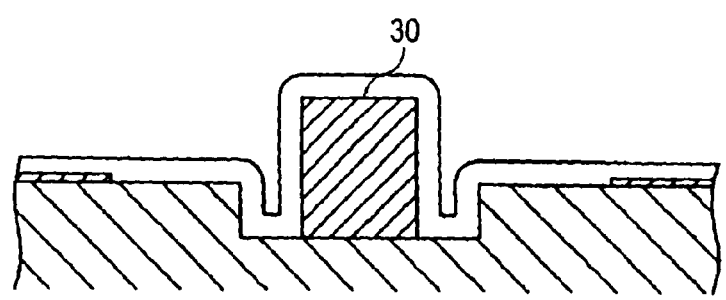
FIG. 20 is an enlarged sectional view taken long the line C—C in FIG. 12.

An example of arrangement of electrodes in another light-emitting device 23 is shown in FIGS. 12 to 20. In FIG. 12, the reference numeral 26 designates a translucent electrode; 27, a p seat electrode; and 28, a p auxiliary electrode. The p auxiliary electrode 28 is formed so as to be integrated with the p seat electrode 27. The p seat electrode 27 is disposed in the center of a side so that the p auxiliary electrode 28 is shaped like a U figure opened upward with the p seat electrode 27 as its center. The reference numeral 25 designates a parting line for the protective film.

An n seat electrode 29 is formed in substantially the center of a side opposite to the p seat electrode 27. An n auxiliary electrode 30 is formed so as to be integrated with the n seat electrode 29. The n auxiliary electrode 30 is extended from the n seat electrode toward the p seat electrode 27.

The reference numeral 31 designates an n electrode-forming surface; and 32, a substrate material surface which is revealed for dicing. The protective film 34 is a portion hatched in FIG. 17.

The device is a square having a length of 600 µm on each side.

Figure 21:
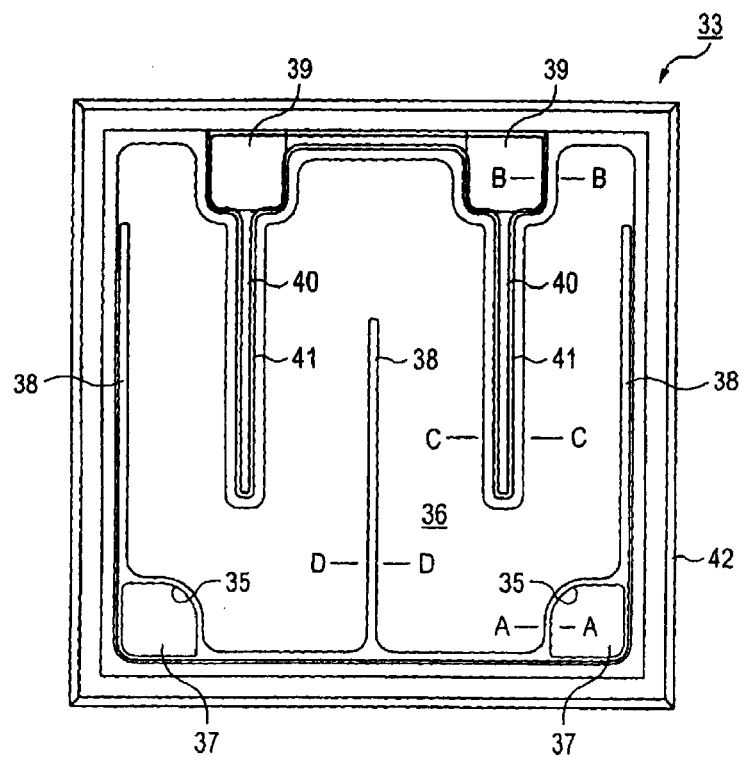
FIG. 21 is a plan view showing an example of arrangement of electrodes in a light-emitting device according to a further embodiment of the invention.
Figure 22:
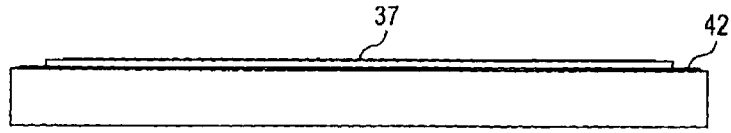
FIG. 22 is a front view showing this example.
Figure 23:
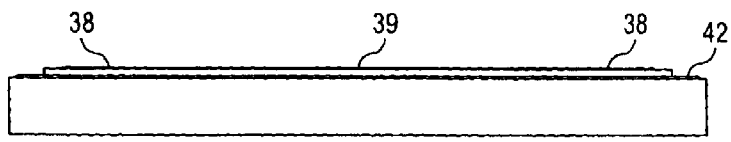
FIG. 23 is a back view showing this example.
Figure 24:
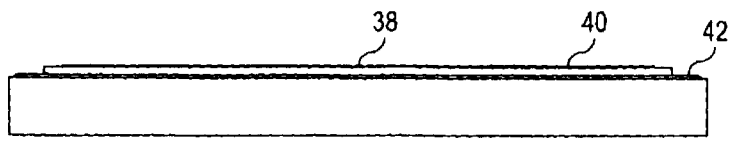
FIG. 24 is a left (right) side view showing this example.
Figure 25:
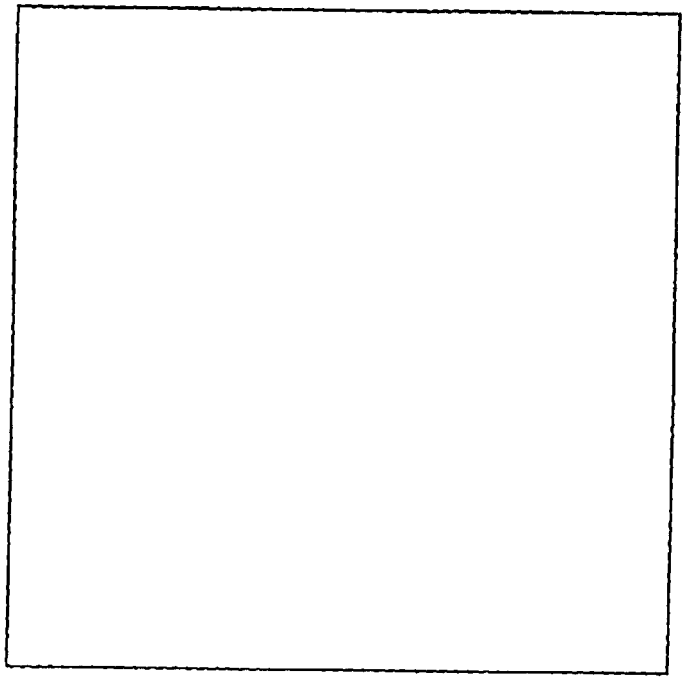
FIG. 25 is a bottom view showing this example.
Figure 26:
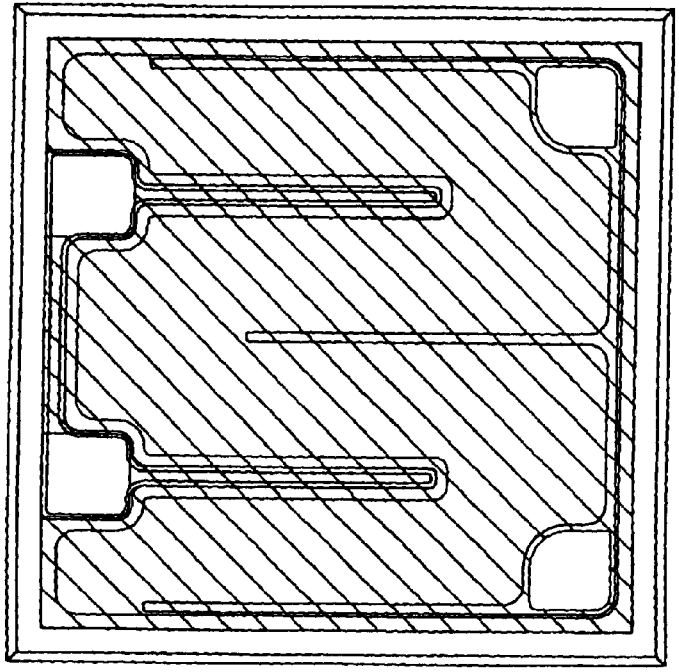
FIG. 26 is a reference plan view showing a transparent portion (transparent electrode)
Figure 27:
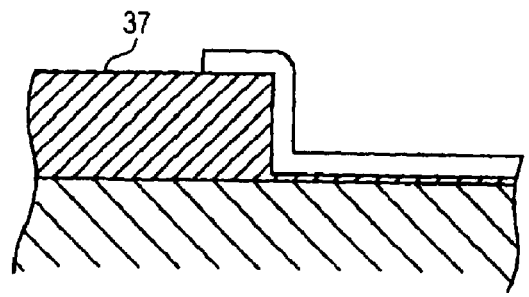
FIG. 27 is a partly cutaway enlarged sectional view taken long the line A—A in FIG. 21.
Figure 28:
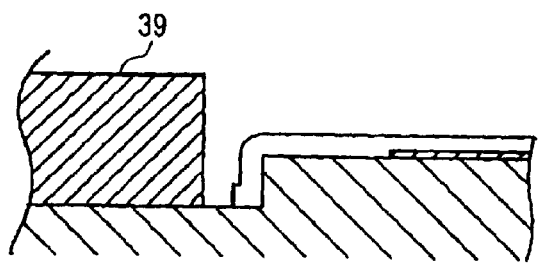
FIG. 28 is a partly cutaway enlarged sectional view taken long the line B—B in FIG. 21.
Figure 29:
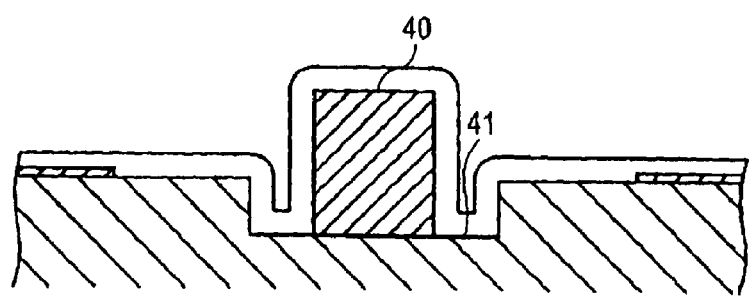
FIG. 29 is an enlarged sectional view taken long the line C—C in FIG. 21.
Figure 30:
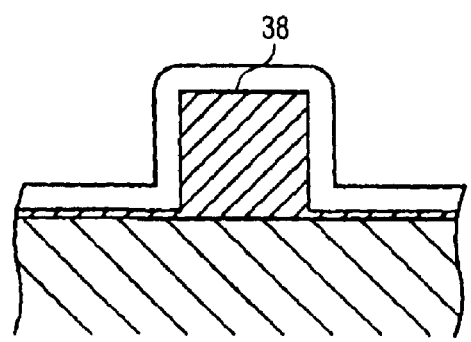
FIG. 30 is an enlarged sectional view taken long the line D—D in FIG. 21.

An example of arrangement of electrodes in a further light-emitting device 33 is shown in FIGS. 21 to 30. In FIG. 21, the reference numeral 36 designates a translucent electrode; 37, p seat electrodes; and 38, a p auxiliary electrode. The p auxiliary electrode 38 is formed so as to be integrated with the p seat electrodes 37. The p seat electrodes 37 are disposed at opposite ends of a side so that the p auxiliary electrode 38 is shaped like an E figure opened upward. The reference numeral 35 designates a parting line for the protective film.

N seat electrodes 39 are formed on a side opposite to the p seat electrodes 37. An n auxiliary electrode 40 is formed so as to be integrated with the n seat electrodes 39. The n auxiliary electrode 40 is shaped like a U figure opened downward. The n seat electrodes 39 are disposed in base portions of the n auxiliary electrode 40. The n auxiliary electrode 40 is disposed so as to be parallel with the p auxiliary electrode 38 and shaped like a comb.

The reference numeral 41 designates an n electrode-forming surface; and 42, a substrate material surface which is revealed for dicing. The protective film 34 is a portion hatched in FIG. 26.

The device is a square having a length of 1000 µm on each side.

Figure 31:
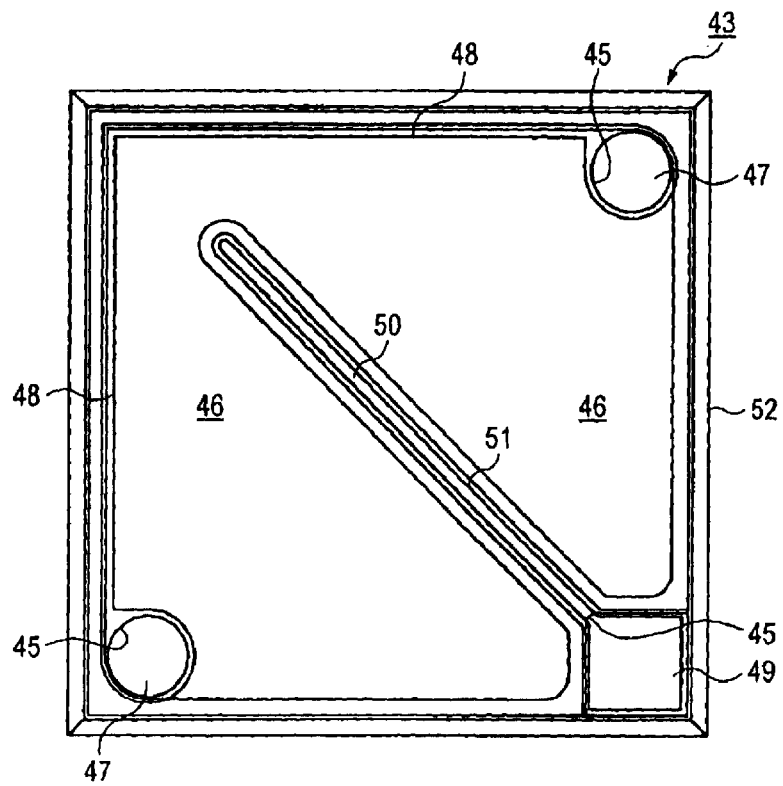
FIG. 31 is a plan view showing an example of arrangement of electrodes in a light-emitting device according to a further embodiment of the invention.

An example of arrangement of electrodes in a further light-emitting device 43 is shown in FIG. 31. In FIG. 31, the reference numeral 46 designates a translucent electrode; 47, p seat electrodes; and 48, a p auxiliary electrode. The p auxiliary electrode 48 is formed so as to be integrated with the p seat electrodes 47. The p seat electrodes 47 are disposed in opposite corner portions. The p auxiliary electrode 48 is formed to be extended from the p seat electrodes 47 and 47 along upper and left sides of the device in the drawing. The reference numeral 45 designates a parting line for the protective film.

An n seat electrode 49 is formed in a corner portion of the device. An n auxiliary electrode 50 is formed so as to be integrated with the n seat electrode 49. The n auxiliary electrode 50 is formed in a range of from the n seat electrode 49 to the central portion of the device so as to be extended to a neighbor of an opposite corner portion.

The reference numeral 51 designates an n electrode-forming surface; and 52, a substrate material surface which is revealed for dicing.

The device is a square having a length of 800 µm on each side.

Figure 32:
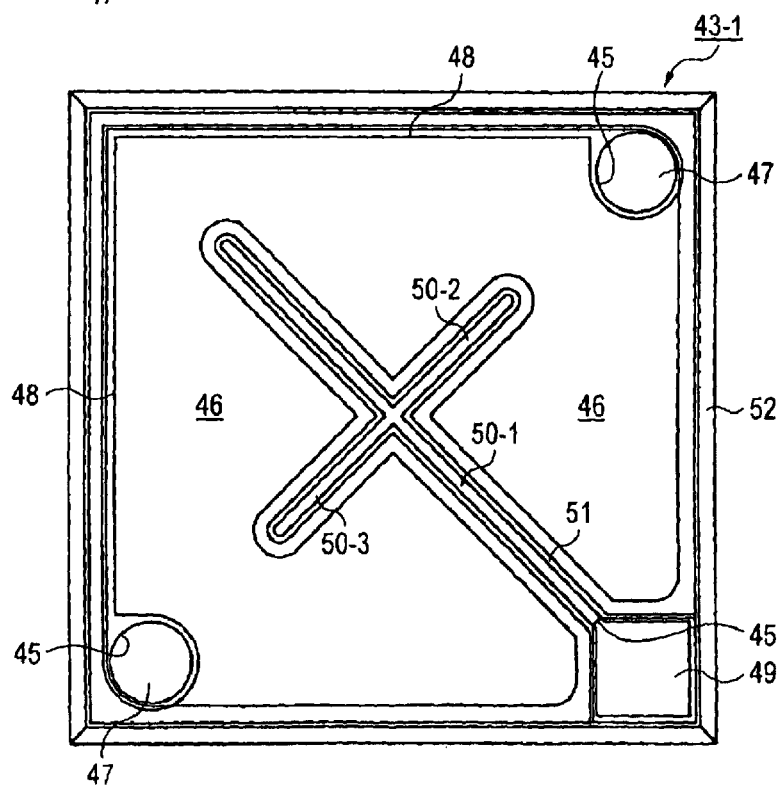
FIG. 32 is a plan view showing an example of arrangement of electrodes in a light-emitting device according to a further embodiment of the invention.

FIG. 32 shows a modification of FIG. 31. In the device 43-1 of FIG. 32, the n auxiliary electrode 50-1 has branches 50-2 and 50-3. The branches 50-2 and 50-3 are extended toward the p seat electrodes 47 and 47 respectively.

In FIG. 32, parts the same as those in FIG. 31 are referred to by numerals the same as those in FIG. 31 for the sake of omission of description thereof.

Figure 33:
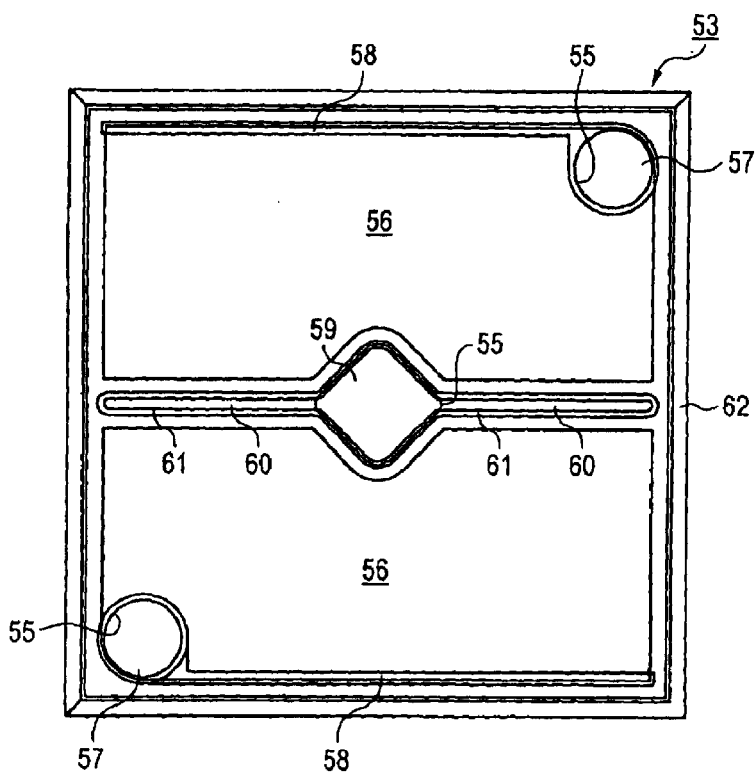
FIG. 33 is a plan view showing an example of arrangement of electrodes in a light-emitting device according to a further embodiment of the invention.

An example of arrangement of electrodes in a further light-emitting device 53 is shown in FIG. 33. In FIG. 33, the reference numeral 56 designates translucent electrodes; 57, p seat electrodes; and 58, p auxiliary electrodes. The p auxiliary electrodes 58 are formed so as to be integrated with the p seat electrodes 57 respectively. The p seat electrodes 57 are disposed in opposite corner portions. The p auxiliary electrodes 58 are formed to be extended from the p seat electrodes 47 and 47 along upper and left sides of the device in the drawing. The reference numeral 55 designates a parting line for the protective film.

An n seat electrode 59 is formed in the central portion of the device. An n auxiliary electrode 60 is formed so as to be integrated with the n seat electrode 59. The n auxiliary electrode 60 is formed in parallel with the p auxiliary electrode 58 from the n seat electrode 59 so as to be extended to a neighbor of the edge of the device.

The reference numeral 61 designates an n electrode-forming surface; and 62, a substrate material surface which is revealed for dicing.

The device is a square having a length of 800 µm on each side.

Figure 34:
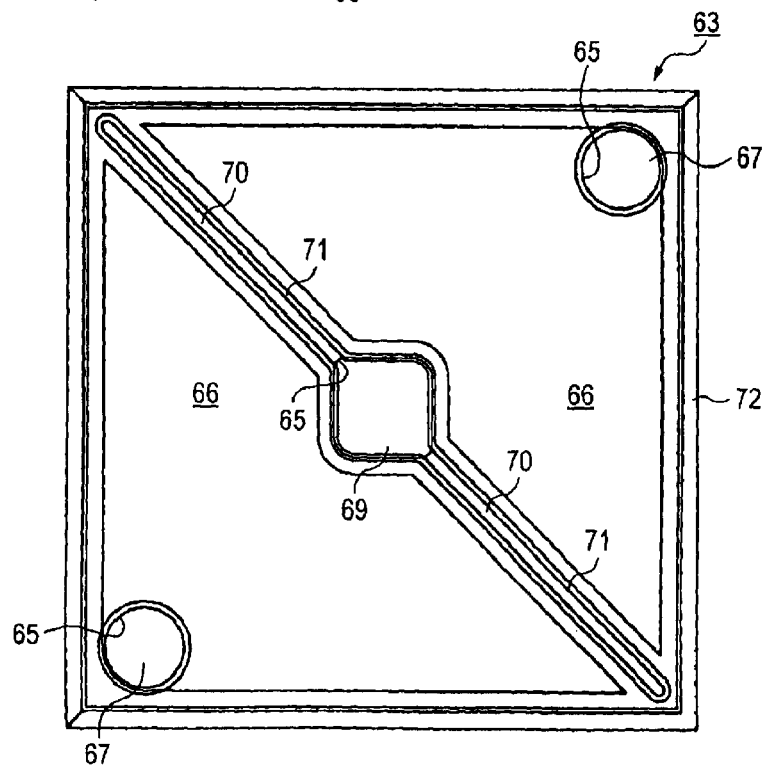
FIG. 34 is a plan view showing an example of arrangement of electrodes in a light-emitting device according to a further embodiment of the invention.

An example of arrangement of electrodes in a further light-emitting device 63 is shown in FIG. 34. In FIG. 34, the reference numeral 66 designates translucent electrodes; and 67, p seat electrodes. In this example, the p auxiliary electrode is omitted. The p seat electrodes 67 are disposed in opposite corner portions. The reference numeral 55 designates a parting line for the protective film.

An n seat electrode 69 is formed in the central portion of the device. An n auxiliary electrode 70 is formed so as to be integrated with the n seat electrode 69. The n auxiliary electrode 70 is extended from the n seat electrode 69 to corner portions of the device in which there is no p seat electrode.

The reference numeral 71 designates an n electrode-forming surface; and 72, a substrate material surface which is revealed for dicing.

The device is a square having a length of 800 µm on each side.

Other examples of arrangement of electrodes in a light-emitting device are shown in FIGS. 35 to 52. In these examples of these drawings, only p electrodes and n electrodes (hatched) are shown for the sake of simplification of description. Also in each of the examples shown in FIGS. 35 to 52, a p electrode or p electrodes are formed on a translucent electrode or translucent electrodes which is or are stuck onto the substantially whole surface of the p-type semiconductor layer, as described in each of the examples shown in FIG. 34 and the drawings before FIG. 34. The n electrode-forming surface and the protective film are not shown in the drawings but are formed in the same manner as in the previous examples. In the following description, positional relations (upper, lower, left and right) of parts are defined on the basis of the drawings only for the sake of convenience of description.

In each of these examples, the length of one side of the light-emitting device is not smaller than 500 µm.

Figure 35:
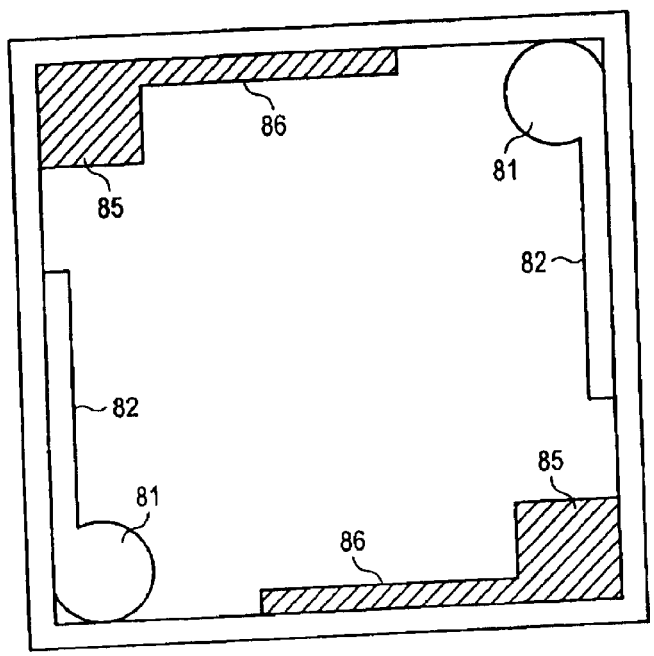
FIG. 35 is a plan view showing an example of arrangement of electrodes in a light-emitting device according to a further embodiment of the invention.

In the example of FIG. 35, p seat electrodes 81 and 81 are formed in opposite corner portions of the device. P auxiliary electrodes 82 and 82 are formed so as to be extended from the p seat electrodes 81 and 81 along respective sides. N seat electrodes 85 and 85 are formed in residual opposite corner portions of the device. N auxiliary electrodes 86 and 86 are formed so as to be extended from the n seat electrodes 85 and 85 along upper and lower sides respectively.

Figure 36:
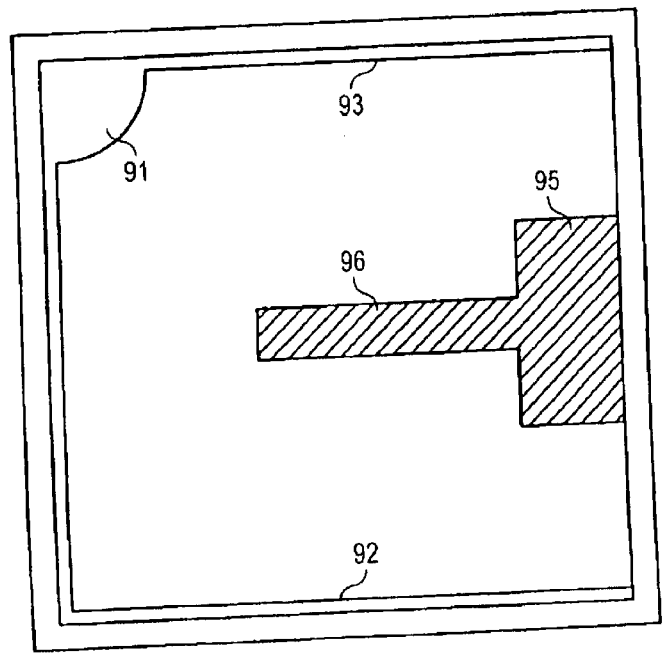
FIG. 36 is a plan view showing an example of arrangement of electrodes in a light-emitting device according to a further embodiment of the invention.

In the example of FIG. 36, a p seat electrode 91 is formed in one corner portion of the device. A first p auxiliary electrode 92 is formed so as to be extended from the p seat electrode 91 along left and lower sides of the device. A second p auxiliary electrode 93 is formed so as to be extended from the p seat electrode 91 along an upper side of the device. An n seat electrode 95 is disposed in the substantially central portion of a right side. An n auxiliary electrode 96 is provided so as to be extended from the n seat electrode 95 to the central portion of the device.

Figure 37:
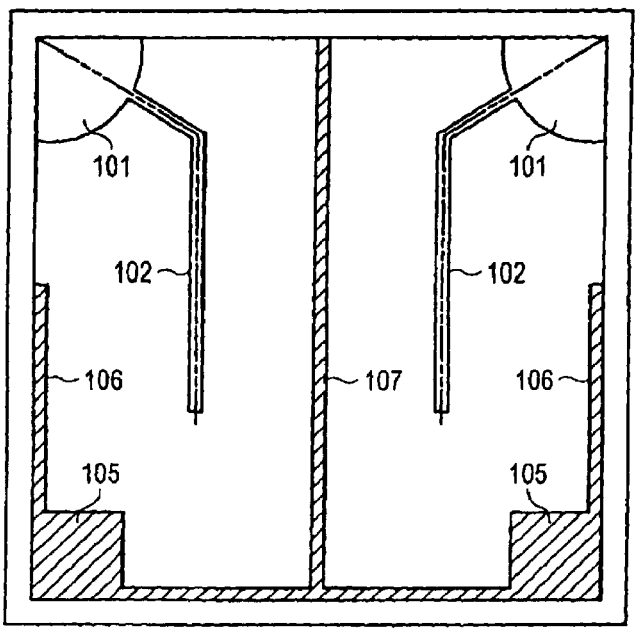
FIG. 37 is a plan view showing an example of arrangement of electrodes in a light-emitting device according to a further embodiment of the invention.

In the example of FIG. 37, p seat electrodes 101 and 101 are formed in two upper corner portions of the device. P auxiliary electrodes 102 and 102 each bent so as to be L-shaped are extended from the p seat electrodes 101 and 101 respectively. N seat electrodes 105 are formed in two lower corner portions respectively. First auxiliary electrodes 106 and 106 are extended upward from the n seat electrodes 105 along left and right sides respectively. A second auxiliary electrode 107 is shaped like a reverse T figure, that is, is extended from a lower side to an upper side through the center of the device. The portion extended upward from the center of the lower side is parallel with the p auxiliary electrodes 102 and 102.

Figure 38:
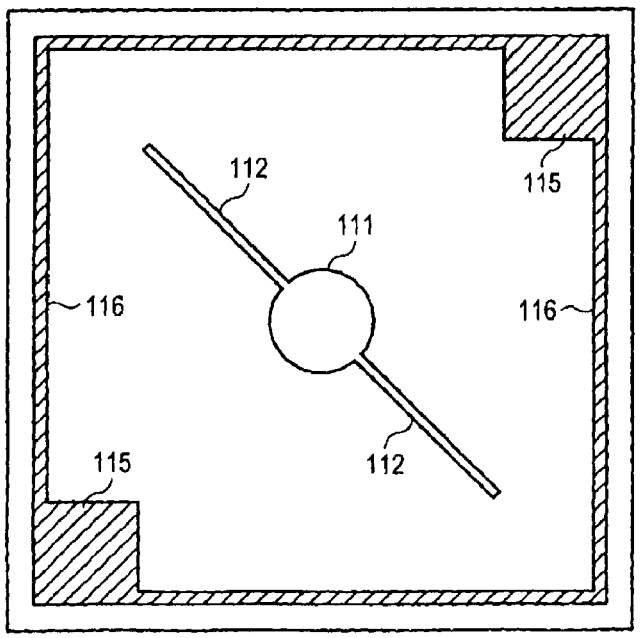
FIG. 38 is a plan view showing an example of arrangement of electrodes in a light-emitting device according to a further embodiment of the invention.

In the example of FIG. 38, a p seat electrode 111 is formed in the central portion of the device. P auxiliary electrodes 112 and 112 are extended on one diagonal line from the p seat electrode 111. N seat electrodes 115 and 115 are formed in opposite corner portions of the device. N auxiliary electrodes 116 and 116 are formed along circumferential sides of the device so that the two n seat electrodes 115 and 115 are connected to each other by the n auxiliary electrodes 116 and 116.

Figure 39:
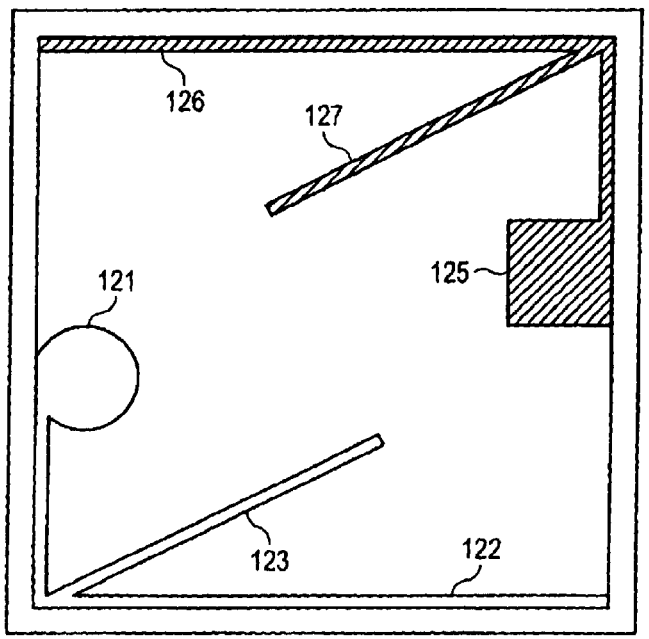
FIG. 39 is a plan view showing an example of arrangement of electrodes in a light-emitting device according to a further embodiment of the invention.

In the example of FIG. 39, a p seat electrode 121 is provided slightly below the center of a left side. A first p auxiliary electrode 122 is extended downward along the left side from the p seat electrode 121 and further extended along a lower side. A second p auxiliary electrode 123 is extended from the lower left corner at an included angle of about 30 degrees with respect to the lower side. An n seat electrode 125 is provided slightly above the center of a right side. A first n auxiliary electrode 126 is extended upward along the right side from the n seat electrode 125 and further extended along an upper side. A second p auxiliary electrode 127 is extended from the upper right corner at an included angle of about 30 degrees with respect to the upper side.

Figure 40:
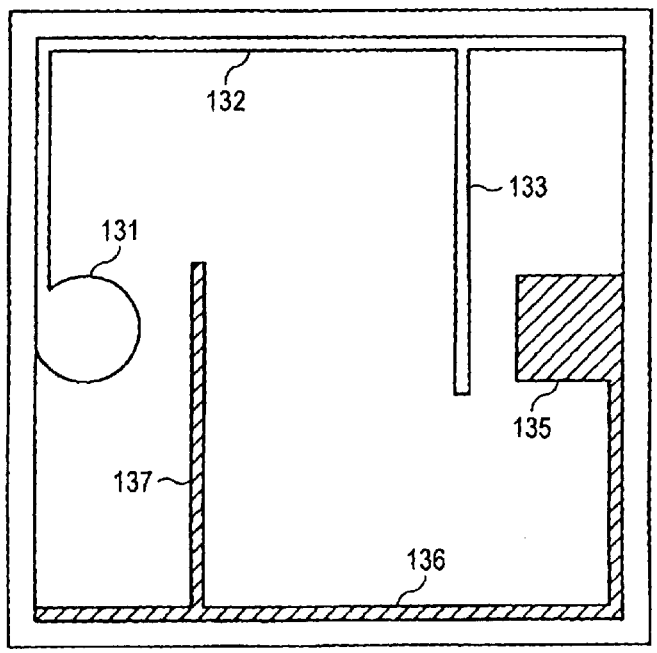
FIG. 40 is a plan view showing an example of arrangement of electrodes in a light-emitting device according to a further embodiment of the invention.

In the example of FIG. 40, a p seat electrode 131 is formed in substantially the center of a left side. A first p auxiliary electrode 132 is extended upward along the left side from the p seat electrode 131 and further extended along an upper side. A second p auxiliary electrode 133 is extended downward perpendicularly from portion on a slightly right-hand side of the upper side center. An n seat electrode 135 is formed in substantially the center of a right side. A first n auxiliary electrode 136 is extended downward along the right side from the n seat electrode 135 and further extended along a lower side. A second n auxiliary electrode 137 is extended upward perpendicularly from a portion on a slightly left-hand side of the lower side center.

Figure 41:
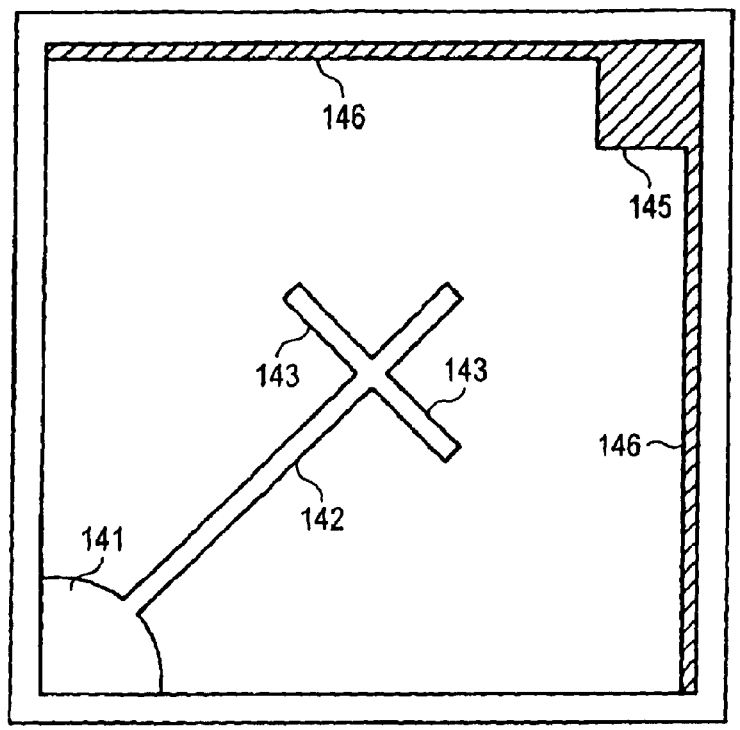
FIG. 41 is a plan view showing an example of arrangement of electrodes in a light-emitting device according to a further embodiment of the invention.

In the example of FIG. 41, a p seat electrode 141 is formed in a lower left corner. A first p auxiliary electrode 142 is extended on a diagonal line from the p seat electrode 141. Second p auxiliary electrodes 143 and 143 are extended perpendicularly from the first p auxiliary electrode 142 in the central portion of the device. An n seat electrode 145 is formed in an upper right corner of the device. First n auxiliary electrodes 146 and 146 are extended from the n seat electrode 145 along upper and right sides respectively.

Figure 42:
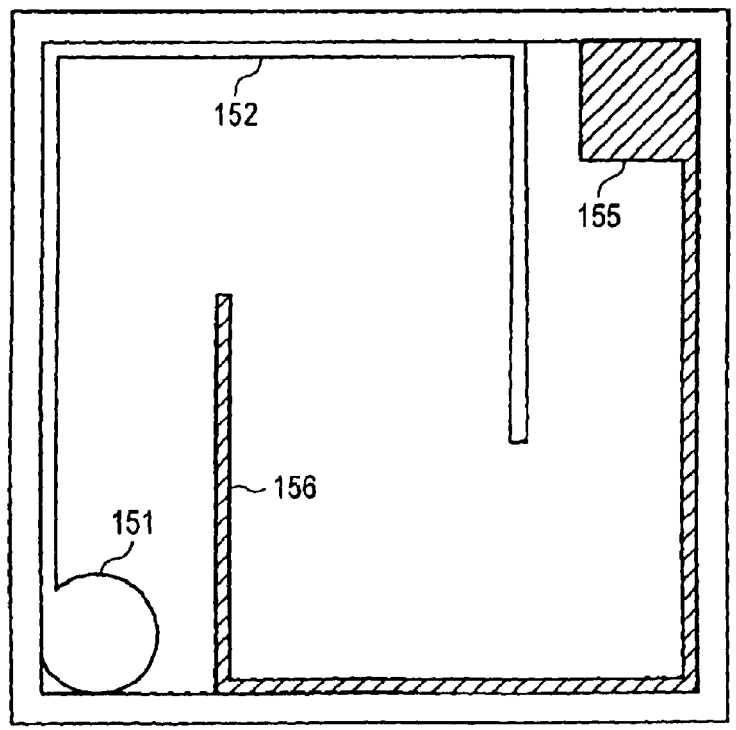
FIG. 42 is a plan view showing an example of arrangement of electrodes in a light-emitting device according to a further embodiment of the invention.

In the example of FIG. 42, a p seat electrode 151 is formed in a lower left corner of the device. A first p auxiliary electrode 152 is extended upward along a left side from the p seat electrode 151 and further extended along an upper side and extended perpendicularly downward from a portion on a slightly right-hand side of the upper side center. An n seat electrode 155 is formed in an upper right corner of the device. A first n auxiliary electrode 156 is extended downward along a right side from the n seat electrode 155 and further extended along a lower side and extended perpendicularly downward from a portion on a slightly left-hand side of the lower side center.

Figure 43:
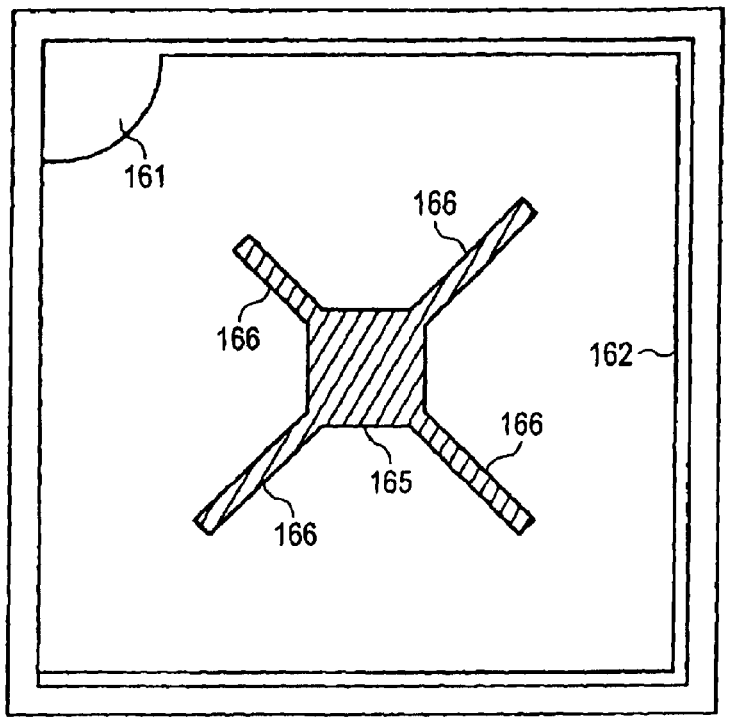
FIG. 43 is a plan view showing an example of arrangement of electrodes in a light-emitting device according to a further embodiment of the invention.

In the example of FIG. 43, a p seat electrode 161 is formed in an upper left corner of the device. A first p auxiliary electrode 162 is extended along the whole of upper, right and left sides. An n seat electrode 165 is formed in substantially the center of the device. First n auxiliary electrodes 166, 166, 166 and 166 are extended on diagonal lines from the n seat electrode 165.

Figure 44:
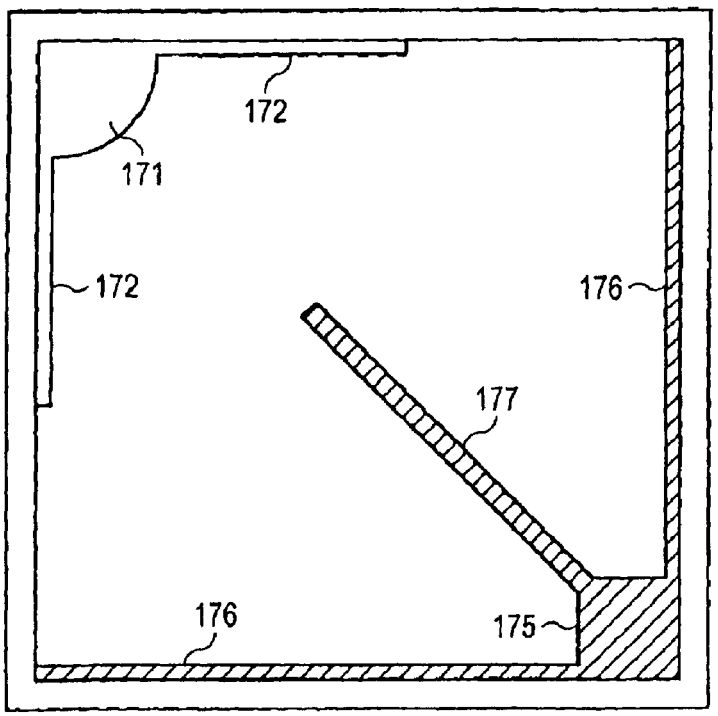
FIG. 44 is a plan view showing an example of arrangement of electrodes in a light-emitting device according to a further embodiment of the invention.

In the example of FIG. 44, a p seat electrode 171 is formed in an upper left corner of the device. P auxiliary electrodes 172 and 172 are extended along upper and left sides respectively from the p seat electrode 171. An n seat electrode 175 is formed in a lower right corner of the device. From the n seat electrode 175, first n auxiliary electrodes 176 and 176 are extended along right and lower sides respectively, and a second n auxiliary electrode 177 is further extended on a diagonal line.

Figure 45:
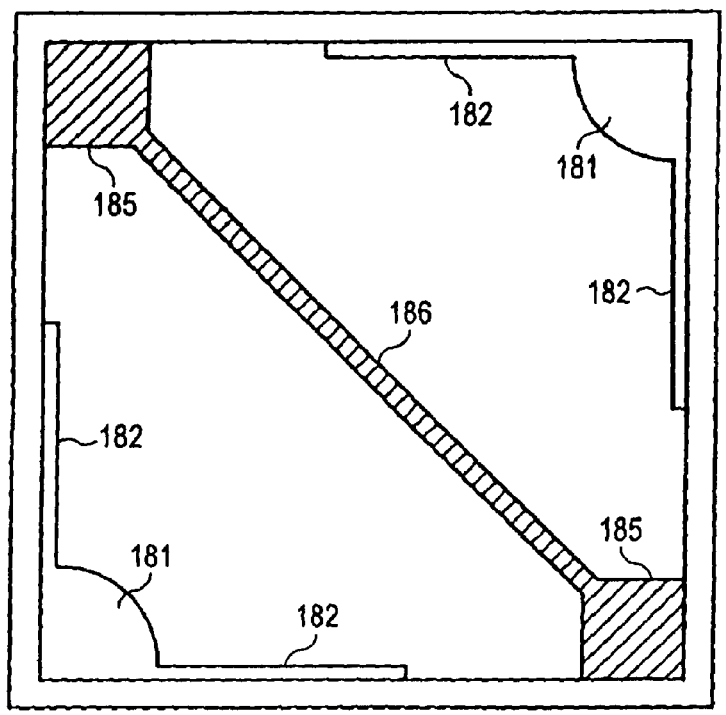
FIG. 45 is a plan view showing an example of arrangement of electrodes in a light-emitting device according to a further embodiment of the invention.

In the example of FIG. 45, p seat electrodes 181 and 181 are formed respectively in a lower left corner and an upper right corner of the device. First p auxiliary electrodes 182, 182, 182 and 182 are extended along respective sides from the p seat electrodes 181 and 181. N seat electrodes 185 and 185 are formed respectively in a lower right corner and an upper left corner of the device. A first n auxiliary electrode 186 is formed so as to connect the n seat electrodes 185 and 185 to each other.

Figure 46:
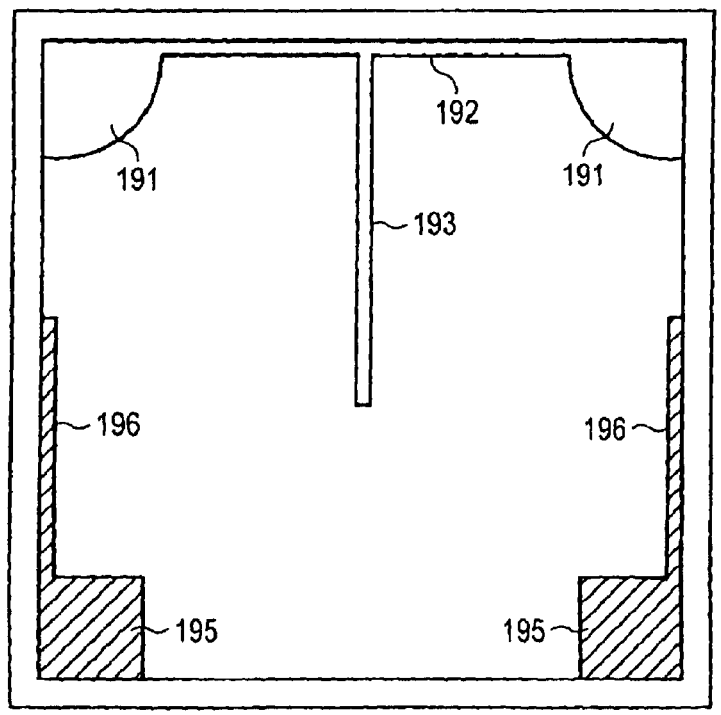
FIG. 46 is a plan view showing an example of arrangement of electrodes in a light-emitting device according to a further embodiment of the invention.

In the example of FIG. 46, p seat electrodes 191 and 191 are formed at opposite ends of an upper side. A first p auxiliary electrode 192 is formed along the upper side so as to connect the p seat electrodes 191 and 191 to each other. A second p auxiliary electrode 193 is extended perpendicularly downward from the center of the first p auxiliary electrode 192. N seat electrodes 195 and 195 are formed at opposite ends of a lower side. First n auxiliary electrodes 196 and 196 are extended upward along left and right sides from the n seat electrodes 195 and 195 respectively.

Figure 47:
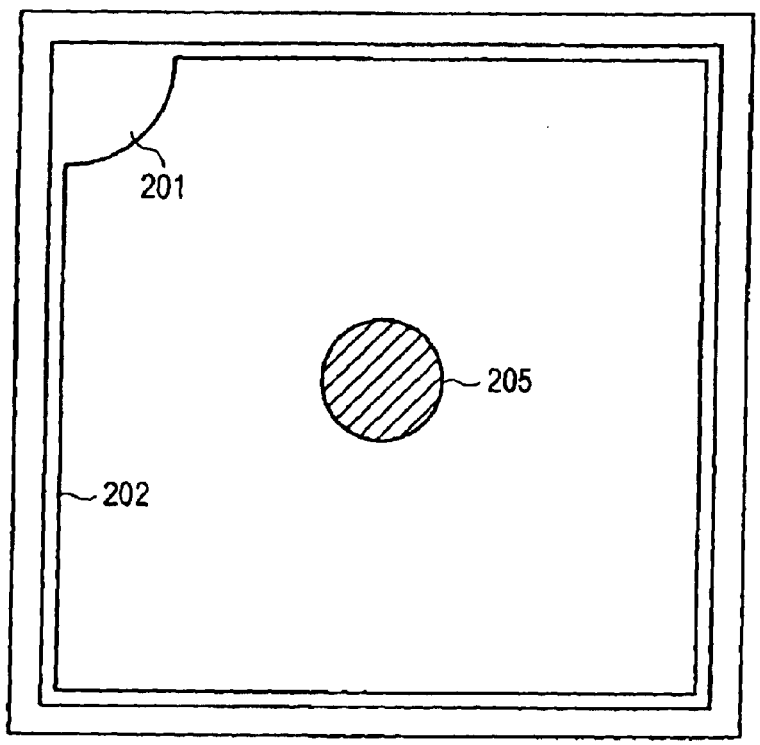
FIG. 47 is a plan view showing an example of arrangement of electrodes in a light-emitting device according to a further embodiment of the invention.

In the example of FIG. 47, a p seat electrode 201 is formed in an upper left corner of the device. A first p auxiliary electrode is extended from the p seat electrode 201 and formed along the whole circumferential portion. An n seat electrode 205 is formed in substantially the center of the device.

Figure 48:
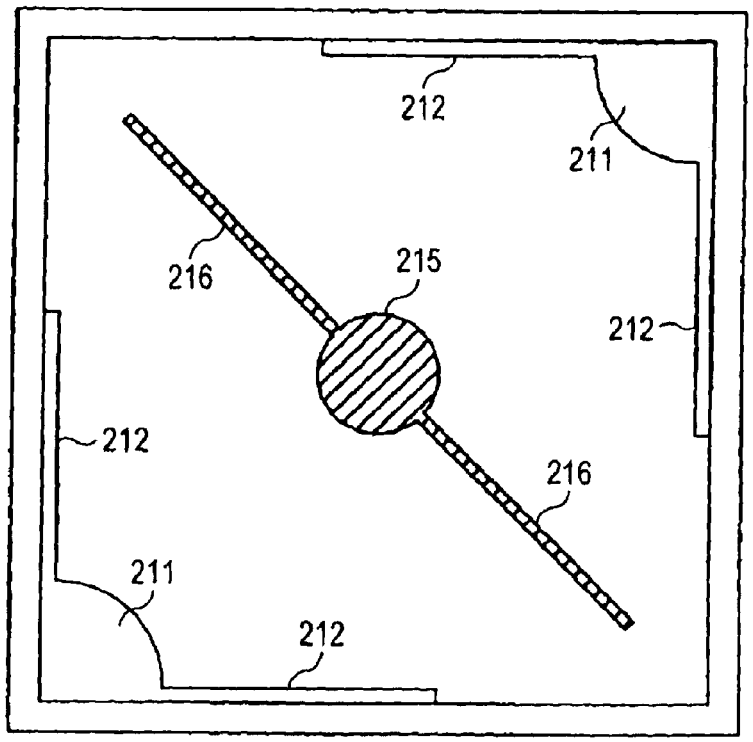
FIG. 48 is a plan view showing an example of arrangement of electrodes in a light-emitting device according to a further embodiment of the invention.

In the example of FIG. 48, p seat electrodes 211 and 211 are formed respectively in a lower left corner and an upper right corner of the device. First p auxiliary electrodes 212, 212, 212 and 212 are extended along respective sides from the p seat electrodes 211 and 211. An n seat electrode 215 is formed in substantially the center of the device. First n auxiliary electrodes 216 and 216 are extended from the n seat electrode 215 on a diagonal line containing no p seat electrode.

Figure 49:
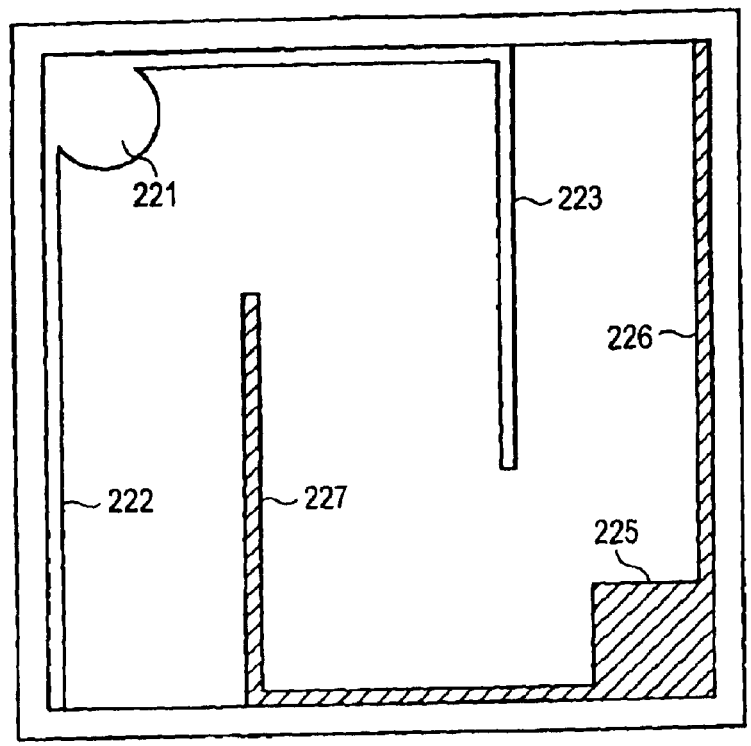
FIG. 49 is a plan view showing an example of arrangement of electrodes in a light-emitting device according to a further embodiment of the invention.

In the example of FIG. 49, a p seat electrode 221 is formed in an upper left corner of the device. From the p seat electrode 221, a first p auxiliary electrode 222 is extended along a left side, and a second p auxiliary electrode 223 is extended along an upper side and further extended perpendicularly downward from a portion on a slightly right-hand side of the upper side center. An n seat electrode 225 is formed in a lower right corner of the device. From the n seat electrode 225, a first n auxiliary electrode 226 is extended along a right side, and a second n auxiliary electrode 227 is extended along a lower side and further extended perpendicularly upward from a portion on a slightly left-hand side of the lower side center.

Figure 50:
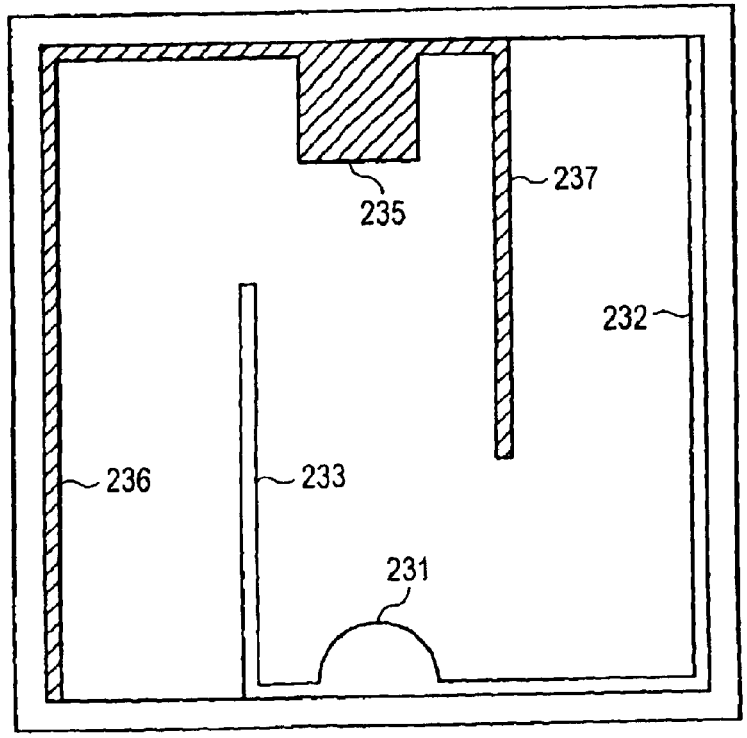
FIG. 50 is a plan view showing an example of arrangement of electrodes in a light-emitting device according to a further embodiment of the invention.

In the example of FIG. 50, a p seat electrode 231 is formed in substantially the center of a lower side. A first p auxiliary electrode 232 is extended rightward along the lower side from the p seat electrode 231 and further extended upward along a right side. Further, a second p auxiliary electrode 233 is extended slightly leftward from the p seat electrode 231 and further extended perpendicularly upward therefrom. An n seat electrode 235 is formed in substantially the center of a lower side. A first n auxiliary electrode 236 is extended leftward along the upper side from the n seat electrode 235 and further extended downward along a left side. Further, a second n auxiliary electrode 237 is extended slightly rightward from the n seat electrode 235 and further extended perpendicularly downward therefrom.

Figure 51:
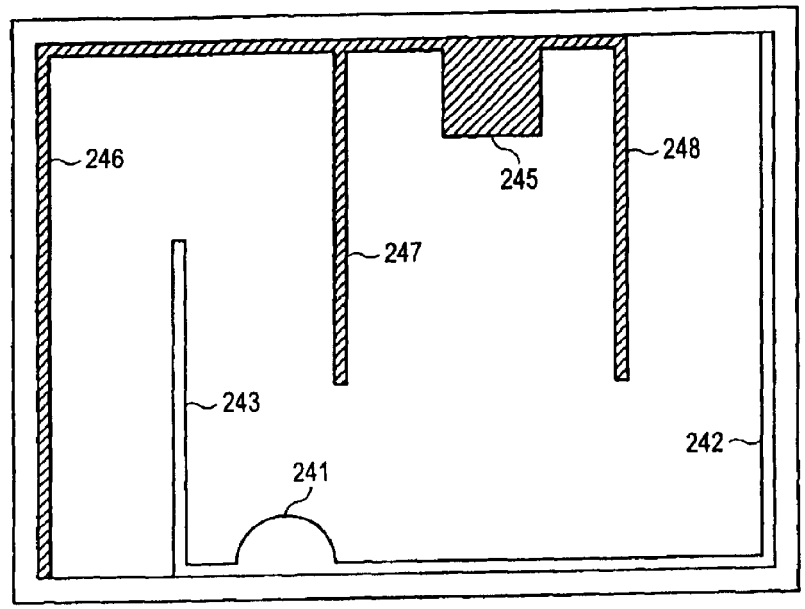
FIG. 51 is a plan view showing an example of arrangement of electrodes in a light-emitting device according to a further embodiment of the invention.

In the example of FIG. 51, the device is a rectangle in plan view. A p seat electrode 241 is formed on a slightly left-hand side of a lower side center. A first p auxiliary electrode 242 is extended rightward along the lower side from the p seat electrode 241 and further extended upward along a right side. Further, a second p auxiliary electrode 243 is extended slightly leftward from the p seat electrode 241 and further extended perpendicularly upward therefrom. An n seat electrode 245 is formed on a slightly right-hand side of an upper side center. A first n auxiliary electrode 246 is extended leftward along the upper side from the n seat electrode 245 and further extended downward along a left side. A second n auxiliary electrode 247 is extended perpendicularly downward from the first auxiliary electrode 246. A third n auxiliary electrode 248 is extended slightly rightward from the n seat electrode 245 and further extended perpendicularly downward.

Figure 52:
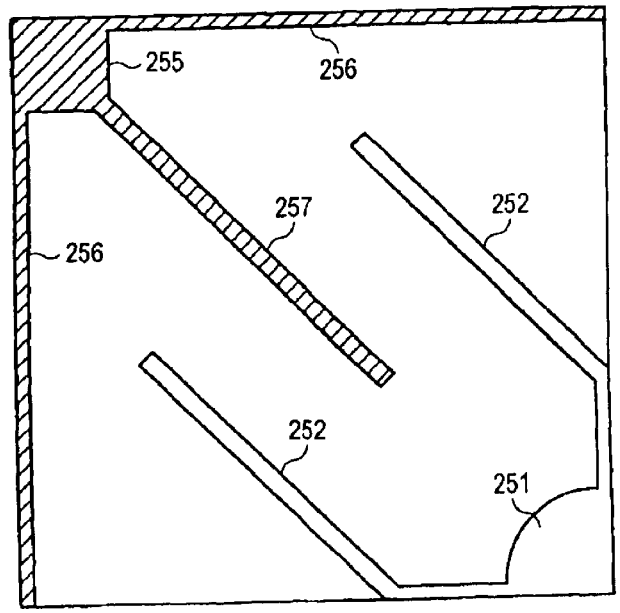
FIG. 52 is a plan view showing an example of arrangement of electrodes in a light-emitting device according to a further embodiment of the invention.

In the example of FIG. 52, a p seat electrode 251 is formed in a lower right corner of the device. First p auxiliary electrodes 252 and 252 are extended slightly along right and lower sides respectively and further extended both upward and leftward in parallel with a diagonal line. An n seat electrode 255 is formed in an upper left corner of the device. First n auxiliary electrodes 256 and 256 are extended from the n seat electrode 255 and formed along an upper side and a left side respectively. Further, a second n auxiliary electrode 257 is extended on a diagonal line from the n seat electrode 255, so that the second n auxiliary electrode 257 is disposed in parallel with the p auxiliary electrodes so as to be shaped like a comb.

Figure 53:
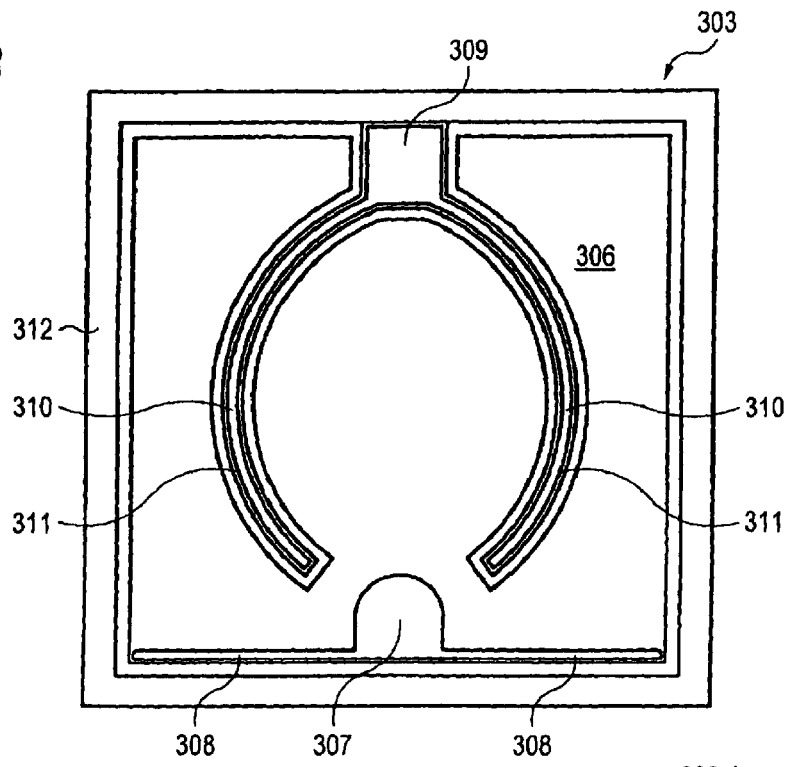
FIG. 53 is a plan view showing an example of arrangement of electrodes in a light-emitting device according to a further embodiment of the invention.

An example of arrangement of electrodes in a further light-emitting device 303 is shown in FIG. 53. In FIG. 53, the reference numeral 306 designates a translucent electrode; 307, a p seat electrode; and 308, a p auxiliary electrode. The p auxiliary electrode 308 is formed so as to be integrated with the p seat electrode 307. The p seat electrode 307 is disposed in substantially the center of a lower side as shown in the drawing. The p auxiliary electrode 308 is extended from opposite sides of the p seat electrode 307 and formed along a lower side.

An n seat electrode 309 is formed in substantially the center of an upper side. An n auxiliary electrode 310 is formed so as to be integrated with the n seat electrode 309. The n auxiliary electrode 310 is extended from the n seat electrode 309 so as to be shaped like a C figure opened toward the central portion of the device. An opening portion of the n auxiliary electrode 310 is opposite to the p seat electrode 307.

The reference numeral 311 designates an n electrode-forming surface; and 312, a substrate material surface which is revealed for dicing.

The device is a square having a length of 1000 μm on each side.

Figure 54:
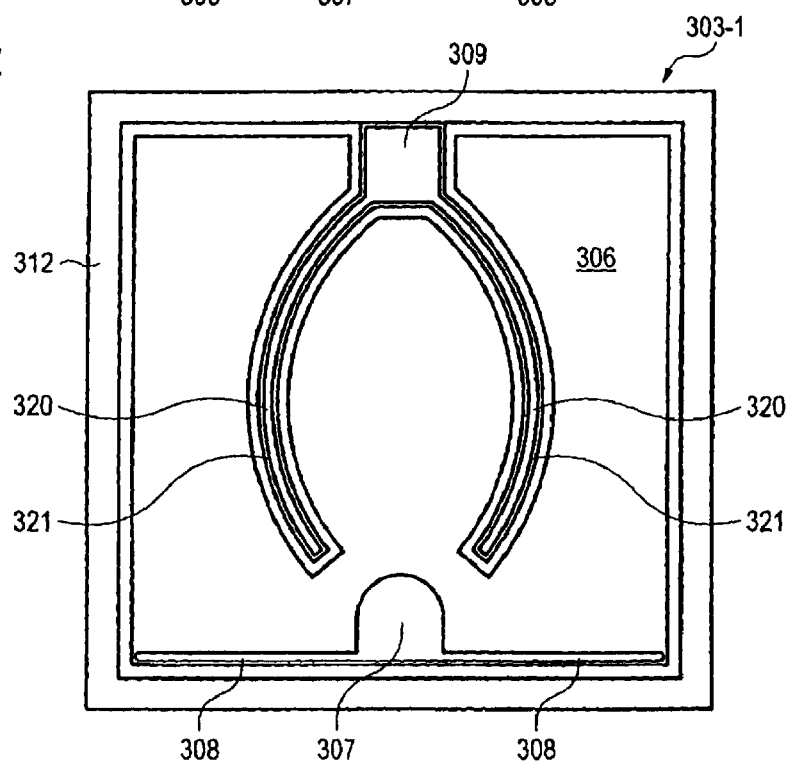
FIG. 54 is a plan view showing an example of arrangement of electrodes in a light-emitting device according to a further embodiment of the invention.

FIG. 54 shows a modification of FIG. 53. An n auxiliary electrode 320 shaped like a C figure deformed compared with the C figure shown in FIG. 53 is used in the device 303-1 of FIG. 54. The reference numeral 321 designates an n electrode-forming surface.

In FIG. 54, parts the same as those in FIG. 53 are referred to by numerals the same as those in FIG. 53 for the sake of omission of description thereof.

Figure 55:
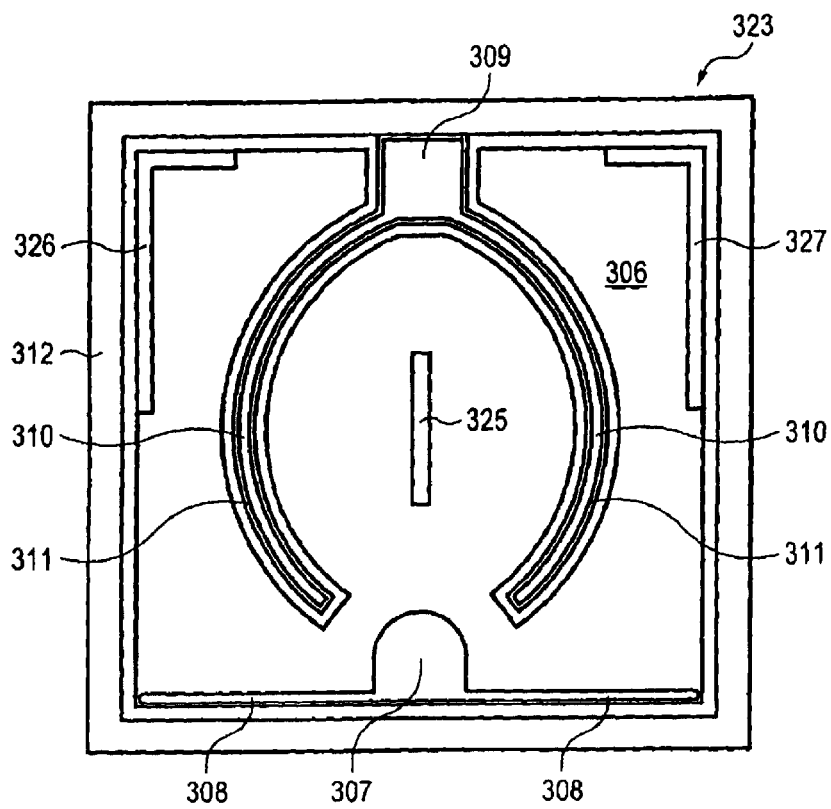
FIG. 55 is a plan view showing an example of arrangement of electrodes in a light-emitting device according to a further embodiment of the invention.

An example of arrangement of electrodes in a further light-emitting device 323 is shown in FIG. 55. In FIG. 55, parts the same as those in FIG. 53 are referred to by numerals the same as those in FIG. 53 for the sake of omission of description thereof. In the light-emitting device 323, a second p auxiliary electrode 325 is disposed in substantially the center, and third and fourth auxiliary electrodes 326 and 327 are formed in corner portions opposite to the first auxiliary electrode 308. The second, third and third auxiliary electrodes 325, 326 and 327 are separated from the p seat electrode 307. The electric potential of each of the second, third and fourth auxiliary electrodes 325, 326 and 327 is defined by the electric potential of a portion nearest to the p seat electrode 307 and the first p auxiliary electrode 308, so that the whole region of each of the second, third and fourth auxiliary electrodes 325, 326 and 327 has the same electric potential. Hence, the same electric potential region given by the second p auxiliary electrode 325 exists at substantially equal distances from the inner side of the C-shaped n auxiliary electrode 310. The electric current distribution in the n auxiliary electrode 310 is made more uniform. Further, with respect to the third and fourth p auxiliary electrodes 326 and 327, the electric potentials at lower ends (portions nearest to the first p auxiliary electrode 308) of the third and fourth p auxiliary electrodes 326 and 327 are given to a counter side (upper side in the drawing) located farthest from the p seat electrode 307 and the first p auxiliary electrode 308. Hence, the electric current distribution in the upper side can be improved.

The device is a square having a length of 1000 μm on each side.

Figure 56:
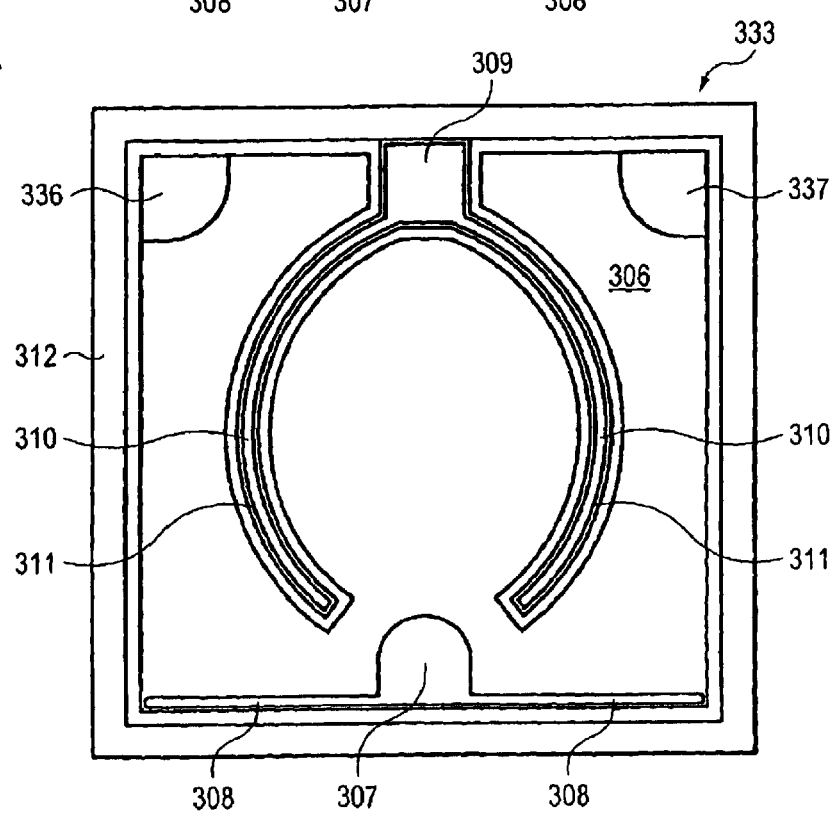
FIG. 56 is a plan view showing an example of arrangement of electrodes in a light-emitting device according to a further embodiment of the invention.

An example of arrangement of electrodes in a further light-emitting device 333 is shown in FIG. 56. In FIG. 56, parts the same as those in FIG. 53 are referred to by numerals the same as those in FIG. 53 for the sake of omission of description thereof. In the light-emitting device 333, a second p seat electrode 336 and a third p seat electrode 337 are formed respectively in opposite ends of an upper side (the side opposite to the first p seat electrode 307). When die-bonding is applied to the second and third p seat electrodes 336 and 337, the electric potentials of the first, second and third p seat electrodes 307, 336 and 337 is equalized to one another. Hence, there can be obtained electric current density uniform on the substantially whole surface of the light-emitting device 333.

The device is a square having a length of 1000 μm on each side.

Figure 57:
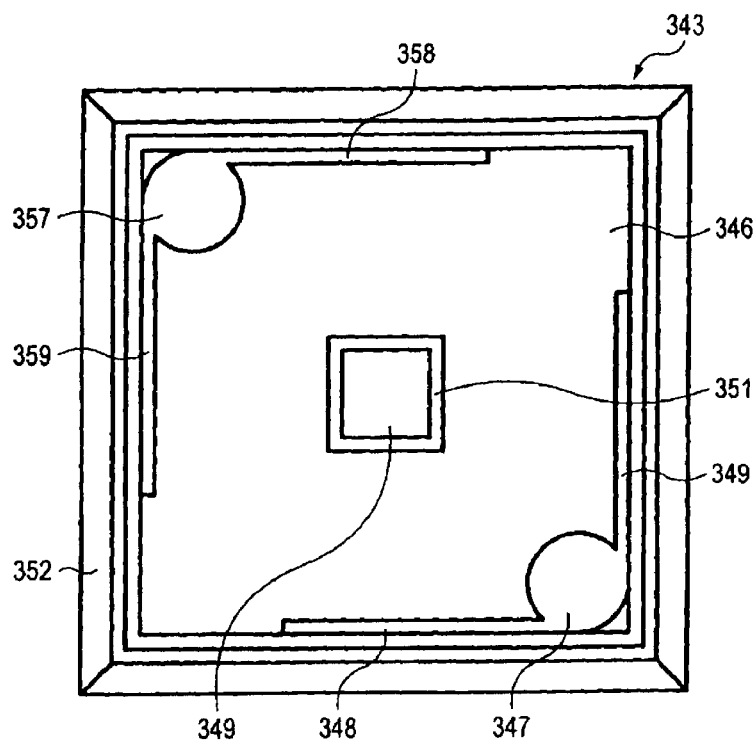
FIG. 57 is a plan view showing an example of arrangement of electrodes in a light-emitting device according to a further embodiment of the invention.

An example of arrangement of electrodes in a further light-emitting device 343 is shown in FIG. 57. In FIG. 57, the reference numeral 346 designates a translucent electrode; 347, a first p seat electrode; and 348 and 349, p auxiliary electrodes formed so as to be integrated with the first p seat electrode 347. The first p seat electrode 347 is formed in one corner of the light-emitting device 343. The p auxiliary electrode 348 is extended along a lower side to a position about ⅔ as large as the lower side. The p auxiliary electrode 349 is extended along a right side to a position about ⅔ as large as the right side. A second p seat electrode 357 is formed in a corner portion opposite to the first p seat electrode 347. A p auxiliary electrode 358 is formed so as to be integrated with the second p seat electrode 357, and is extended along an upper side to a position about ⅔ as large as the upper side. A p auxiliary electrode 359 is further formed so as to be integrated with the second p seat electrode 357, and is extended along a left side to a position about ⅔ as large as the left side.

An n seat electrode 349 is formed in substantially the center.

The reference numeral 351 designates an n electrode-forming surface; and 352, a substrate material surface which is revealed for dicing.

Figure 58:
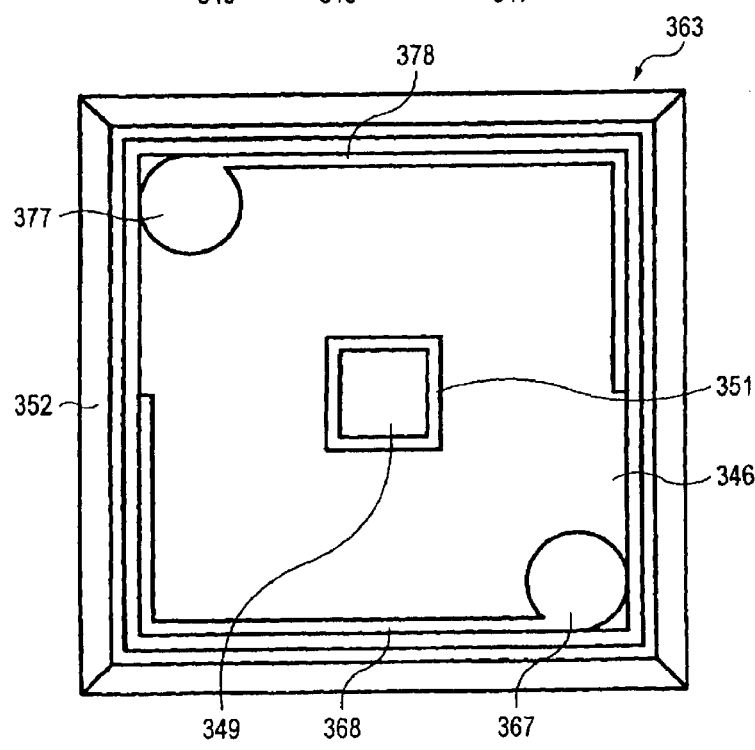
FIG. 58 is a plan view showing an example of arrangement of electrodes in a light-emitting device according to a further embodiment of the invention.

An example of arrangement of electrodes in a further light-emitting device 363 is shown in FIG. 58. In FIG. 57, parts the same as those in FIG. 56 are referred to by numerals the same as those in FIG. 56 for the sake of omission of description thereof. The reference numeral 367 designates a first p seat electrode; and 368, a p auxiliary electrode formed so as to be integrated with the first p seat electrode 367. The first p seat electrode 367 is formed in one corner of the light-emitting device 363. The p auxiliary electrode 368 is extended from a lower side to a left side so as to reach a position about a half as large as the left side. A second p seat electrode 377 is formed in a corner portion opposite to the first p seat electrode 367. A p auxiliary electrode 378 is formed so as to be integrated with the second p seat electrode 377, and is extended from an upper side to a right side so as to reach a position about a half as large as the right side.

INDUSTRIAL APPLICABILITY

The invention is not limited to the description on the mode for carrying out the invention and the embodiments at all. Various modifications which can be easily conceived by those skilled in the art may be contained in the invention without departing from the description of claims.

The following paragraphs are disclosed.

11. A Group III nitride compound semiconductor device characterized in that an n auxiliary electrode is extended from an n seat electrode to a central portion of the device in a plan view of the device.

12. A Group III nitride compound semiconductor device according to the paragraph 11, characterized in that the device is a rectangle in plan view, and has a length of not smaller than 500 μm on one side.

13. A Group III nitride compound semiconductor device according to the paragraph 11 or 12, characterized in that the device has a translucent electrode, and a p electrode constituted by a p seat electrode and a p auxiliary electrode extended from the p seat electrode.

14. A Group III nitride compound semiconductor device according to the paragraph 13, characterized in that the distance from any point of the translucent electrode to either of the p seat electrode and the p auxiliary electrode is in a range of from 0 to 1000 μm.

15. A Group III nitride compound semiconductor according to the paragraph 13 or 14, characterized in that the n auxiliary electrode and the p auxiliary electrode are arranged like a comb.

16. A Group III nitride compound semiconductor device according to any one of the paragraphs 13 through 15, characterized in that the n auxiliary electrode and the p auxiliary electrode include portions arranged in parallel with each other.

17. A Group ITT nitride compound semiconductor device according to any one of the paragraphs 13 through 16, characterized in that a plurality of n seat electrodes as described above and a plurality of p seat electrodes as described above are arranged.

18. A Group III nitride compound semiconductor device according to any one of the paragraphs 11 through 17, characterized by having either a light-emitting device structure or a light-receiving device structure.

21. A Group III nitride compound semiconductor device characterized in that the distance from any point of a translucent electrode to either a p seat electrode or a p auxiliary electrode is in a range of from 0 to 1000 μm.

22. A Group III nitride compound semiconductor device according to the paragraph 21, characterized in that the device is a rectangle in plan view, and has a length of not smaller than 500 μm on one side.

23. A Group III nitride compound semiconductor according to the paragraph 21 or 22, characterized in that the n auxiliary electrode and the p auxiliary electrode are arranged like a comb.

24. A Group III nitride compound semiconductor device according to any one of the paragraphs 21 through 23, characterized in that the n auxiliary electrode and the p auxiliary electrode include portions arranged in parallel with each other.

25. A Group III nitride compound semiconductor device according to any one of the paragraphs 21 through 24, characterized in that a plurality of n seat electrodes as described above and a plurality of p seat electrodes as described above are arranged.

26. A Group III nitride compound semiconductor device according to any one of the paragraphs 21 through 25, characterized by having either a light-emitting device structure or a light-receiving device structure.

31. A Group III nitride compound semiconductor having:
an n electrode having an n seat electrode, and an n auxiliary electrode;

a translucent electrode; and
a p electrode having a p seat electrode, and a p auxiliary electrode,
the device characterized in that then auxiliary electrode and the p auxiliary electrode are arranged like a comb in a plan view of the device.

32. A Group III nitride compound semiconductor device according to the paragraph 31, characterized in that the device is a rectangle in plan view, and has a length of not smaller than 500 µm on one side.

33. A Group III nitride compound semiconductor device according to the paragraph 31 or 32, characterized in that a plurality of n seat electrodes as described above and a plurality of p seat electrodes as described above are arranged.

34. A Group III nitride compound semiconductor device according to any one of the paragraphs 31 through 33, characterized by having either a light-emitting device structure or a light-receiving device structure.

41. A Group III nitride compound semiconductor having:
an n electrode having an n seat electrode, and an n auxiliary electrode;
a translucent electrode; and
a p electrode having a p seat electrode, and a p auxiliary electrode,
the device characterized in that then auxiliary electrode and the p auxiliary electrode include portions arranged in parallel with each other in a plan view of the device.

42. A Group III nitride compound semiconductor device according to the paragraph 41, characterized in that the device is a rectangle in plan view, and has a length of not smaller than 500 µm on one side.

43. A Group III nitride compound semiconductor device according to the paragraph 41 or 42, characterized in that a plurality of n seat electrodes as described above and a plurality of p seat electrodes as described above are arranged.

44. A Group III nitride compound semiconductor device according to any one of the paragraphs 41 through 43, characterized by having either a light-emitting device structure or a light-receiving device structure.

51. A Group III nitride compound semiconductor device characterized in that: the device is a rectangle in plan view, and has a length of not smaller than 500 µm on one side; and the device has a plurality of n seat electrodes, and a plurality of p seat electrodes.

52. A Group III nitride compound semiconductor device according to the paragraph 51, characterized in that: two n seat electrodes are disposed on a first side whereas two p seat electrodes are disposed on a second side opposite to the first side; and n auxiliary electrodes are extended from the n seat electrodes whereas p auxiliary electrodes are extended from the p seat electrodes.

53. A Group III nitride compound semiconductor device according to the paragraph 51 or 52, characterized by having either a light-emitting device structure or a light-receiving device structure.

What is claimed is:

1. A Group III nitride compound semiconductor device, comprising:
an n electrode; and
a p electrode, wherein
an outermost diameter of said Group III nitride compound semiconductor device is not smaller than 700 µm, and
a distance from said n electrode to a farthest point of said p electrode is not larger than 500 µm.

2. A Group III nitride compound semiconductor device according to claim 1, wherein said device is a rectangle in plan view, and has a length of not smaller than 500 µm on one side.

3. A Group III nitride compound semiconductor device according to claim 1, wherein said n electrode includes an n seat electrode and an n auxiliary electrode, which extends from said n seat electrode, and at least one part of said n auxiliary electrode extends to a central portion of said device in a plan view of said device.

4. A Group III nitride compound semiconductor device according to claim 1, wherein said p electrode includes a p seat electrode and a p auxiliary electrode, which extends from said p seat electrode.

5. A Group III nitride compound semiconductor device according to claim 4, wherein said devices further comprises:
a translucent electrode on which said p electrode is provided,
wherein a distance between any point of said translucent electrode and either said p seat electrode or said p auxiliary electrode is in a range of from 0 to 1000 µm.

6. A Group III nitride compound semiconductor according to claim 4, wherein said n electrode includes an n seat electrode and an n auxiliary electrode, which extends from said n seat electrode, and said n auxiliary electrode and said p auxiliary electrode are arranged like a comb.

7. A Group III nitride compound semiconductor device according to claim 6, wherein said n seat electrode comprises a plurality of n seat electrodes and said p seat electrode comprises a plurality of p seat electrodes.

8. A Group III nitride compound semiconductor device according to claim 4, wherein said n electrode includes an n seat electrode and an n auxiliary electrode, which extends from said n seat electrode, and said n auxiliary electrode and said p auxiliary electrode include portions disposed in parallel with each other.

9. A Group III nitride compound semiconductor device according to claim 8, wherein said n seat electrode comprises a plurality of n seat electrodes and said p seat electrode comprises a plurality of p seat electrodes.

10. A Group III nitride compound semiconductor device according to claim 1, including a light-emitting device structure or a light-receiving device structure.

11. A Group III nitride compound semiconductor device, comprising:
an n electrode; and
a p electrode, wherein
an outermost diameter of said Group III nitride compound semiconductor device is not smaller than 700 µm, and
a distance X µm from any point on said p electrode to said n electrode satisfies the requirement:

$$X = t/\tilde{n},$$

in which t is a thickness of an n-type semiconductor layer and $\tilde{n}$ is a resistivity of the n-type semiconductor layer.

12. A Group III nitride compound semiconductor device, comprising:
an n electrode;
an n-type semiconductor layer with a resistivity of from 0.004 to 0.01 Ω·m and a thickness of from 3 to 5 µm; and
a p electrode, wherein
an outermost diameter of said Group III nitride compound semiconductor device is not smaller than 700 µm, and
a distance from said n electrode to a farthest point of said p electrode is in a range of from 300 to 500 µm.

* * * * *